(12) United States Patent
Cui et al.

(10) Patent No.: US 9,379,335 B2
(45) Date of Patent: Jun. 28, 2016

(54) BENZODIPYRROLIDONES AND THEIR POLYMERS: SYNTHESIS AND APPLICATIONS FOR ORGANIC ELECTRONICS AND OPTOELECTRONICS

(71) Applicant: The Regents of the University of California, Oakland, CA (US)

(72) Inventors: Weibin Cui, Santa Barbara, CA (US); Fred Wudl, Montecito, CA (US)

(73) Assignee: The Regents of the University of California, Oakland, CA (US)

( * ) Notice: Subject to any disclaimer, the term of this patent is extended or adjusted under 35 U.S.C. 154(b) by 309 days.

(21) Appl. No.: 13/858,755

(22) Filed: Apr. 8, 2013

(65) Prior Publication Data
US 2013/0264552 A1   Oct. 10, 2013

Related U.S. Application Data

(60) Provisional application No. 61/621,561, filed on Apr. 8, 2012.

(51) Int. Cl.
| | |
|---|---|
| *H01L 51/00* | (2006.01) |
| *C08G 69/00* | (2006.01) |
| *C08K 3/04* | (2006.01) |
| *C08G 61/12* | (2006.01) |

(52) U.S. Cl.
CPC .......... *H01L 51/0072* (2013.01); *C08G 69/00* (2013.01); *H01L 51/0035* (2013.01); *C08G 61/123* (2013.01); *C08G 61/124* (2013.01); *C08G 61/126* (2013.01); *C08G 2261/124* (2013.01); *C08G 2261/1412* (2013.01); *C08G 2261/226* (2013.01); *C08G 2261/3223* (2013.01); *C08G 2261/3241* (2013.01); *C08G 2261/3243* (2013.01); *C08G 2261/344* (2013.01); *C08G 2261/411* (2013.01); *C08G 2261/414* (2013.01); *C08G 2261/91* (2013.01); *C08K 3/04* (2013.01); *H01L 51/0053* (2013.01); *Y02E 10/549* (2013.01)

(58) Field of Classification Search
CPC . H01L 51/0035; H01L 51/00; H01L 51/0067; C08G 61/12; C08G 61/124
USPC .................. 252/501.1, 500, 301.35; 528/326; 548/433; 549/458
See application file for complete search history.

(56) References Cited

U.S. PATENT DOCUMENTS

| | | | | |
|---|---|---|---|---|
| 4,115,404 A | * | 9/1978 | Greenhalgh et al. | 549/299 |
| 5,665,150 A | * | 9/1997 | Schwarz | 106/31.43 |
| 2007/0112172 A1 | * | 5/2007 | Li et al. | 528/377 |
| 2009/0065766 A1 | | 3/2009 | Li | |
| 2013/0175481 A1 | * | 7/2013 | Blouin et al. | 252/501.1 |
| 2013/0264552 A1 | * | 10/2013 | Cui et al. | 257/40 |
| 2014/0302637 A1 | * | 10/2014 | Hayoz et al. | 438/99 |

FOREIGN PATENT DOCUMENTS

| | | |
|---|---|---|
| WO | 2008000664 | 1/2008 |
| WO | 2012003918 | 1/2012 |
| WO | WO 2013050401 A2 * | 4/2013 |

OTHER PUBLICATIONS

U.S. Appl. No. 61/542,830, filed Oct. 4, 2011.*
U.S. Appl. No. 61/596,755, filed Feb. 9, 2012.*
Bijleveld et al., "Poly (diketopyrrolopyrrole—terthiophene) for ambipolar logic and photovoltaics." Journal of the American Chemical Society 131.46 (2009): 16616-16617.
Bijleveld et al., "Efficient solar cells based on an easily accessible diketopyrrolopyrrole polymer." Advanced materials 22.35 (2010): E242-E246.
Bronstein et al., "Thieno [3, 2-b] thiophene—diketopyrrolopyrrole-containing polymers for high-performance organic field-effect transistors and organic photovoltaic devices." Journal of the American Chemical Society 133.10 (2011): 3272-3275.
Bürgi et al., "High-Mobility Ambipolar Near-Infrared Light-Emitting Polymer Field-Effect Transistors." Advanced Materials 20.11 (2008): 2217-2224.
Cui et al., "Benzodipyrrolidones and their polymers." Macromolecules 44.20 (2011): 7869-7873.
Dibenedetto et al., "Molecular Self-Assembled Monolayers and Multilayers for Organic and Unconventional Inorganic Thin-Film Transistor Applications." Advanced materials 21.14-15 (2009): 1407-1433.
Dimitrakopoulos et al., "Organic thin film transistors for large area electronics." Advanced Materials 14.2 (2002): 99-117.
Farnum et al., "Attempted reformatskii reaction of benzonitrile, 1, 4-diketo-3, 6-diphenylpyrrolo [3, 4-C] pyrrole. A lactam analogue of pentalene." Tetrahedron Letters 15.29 (1974): 2549-2552.
Friend et al., "Electroluminescence in conjugated polymers." Nature 397.6715 (1999): 121-128.
Greenhalgh et al., "The synthesis of quinodimethanes in the benzodifuranone and benzodipyrrolidone series." Dyes and Pigments 1.2 (1980): 103-120.
Günes et al., "Conjugated polymer-based organic solar cells." Chemical reviews 107.4 (2007): 1324-1338.

(Continued)

*Primary Examiner* — Douglas McGinty
(74) *Attorney, Agent, or Firm* — Gates & Cooper LLP

(57) ABSTRACT

Disclosed is the synthesis of benzodipyrrolidone and their polymers and small molecules for electronic and optoelectronic applications. Also disclosed are devices that incorporate such polymers and small molecules.

21 Claims, 25 Drawing Sheets

(56) References Cited

OTHER PUBLICATIONS

Ha et al., "2, 5-Bis (2-octyldodecyl) pyrrolo [3, 4-c] pyrrole-1, 4-(2 H, 5 H)-dione-Based Donor-Acceptor Alternating Copolymer Bearing 5, 5'-Di (thiophen-2-yl)-2, 2'-biselenophene Exhibiting 1.5 cm2 V-1-s-1 Hole Mobility in Thin-Film Transistors." Journal of the American Chemical Society 133.27 (2011): 10364-10367.

Huang et al., "Highly Efficient Polymer White-Light-Emitting Diodes Based on Lithium Salts Doped Electron Transporting Layer." Advanced Materials 21.3 (2009): 361-365.

Huo et al., "Bandgap and molecular level control of the low-bandgap polymers based on 3, 6-dithiophen-2-yl-2, 5-dihydropyrrolo [3, 4-c] pyrrole-1, 4-dione toward highly efficient polymer solar cells." Macromolecules 42.17 (2009): 6564-6571.

Kanimozhi et al., "Synthesis of diketopyrrolopyrrole containing copolymers: a study of their optical and photovoltaic properties." The Journal of Physical Chemistry B 114.9 (2010): 3095-3103.

Kraft et al., "Electroluminescent conjugated polymersÐ seeing polymers in a new light" Angew. Chem. Int. End Engl 37 (1998): 402-428.

Li, Y. et al. "A High Mobility P-Type DPP-Thieno [3, 2-b] thiophene Copolymer for Organic Thin-Film Transistors." Advanced Materials 22.43 (2010): 4862-4866.

Li et al., "Annealing-Free High-Mobility Diketopyrrolopyrrole-Quaterthiophene Copolymer for Solution-Processed Organic Thin Film Transistors." Journal of the American Chemical Society 133.7 (2011): 2198-2204.

Li et al., "Polymer solar cells." Nature Photonics 6.3 (2012): 153-161.

Nelson et al., "Transistor paint: high mobilities in small bandgap polymer semiconductor based on the strong acceptor, diketopyrrolopyrrole and strong donor, dithienopyrrole." Advanced Materials 22.41 (2010): 4617-4621.

Qu et al., "New diketopyrrolopyrrole (DPP) dyes for efficient dye-sensitized solar cells." The Journal of Physical Chemistry C 114.2 (2009): 1343-1349.

Sonar et al., "A Low-Bandgap Diketopyrrolopyrrole-Benzothiadiazole-Based Copolymer for High-Mobility Ambipolar Organic Thin-Film Transistors." Advanced Materials 22.47 (2010): 5409-5413.

Tamayo et al., "Design, synthesis, and self-assembly of oligothiophene derivatives with a diketopyrrolopyrrole core." The Journal of Physical Chemistry C 112.39 (2008): 15543-15552.

Thompson et al., "Polymer-fullerene composite solar cells." Angewandte Chemie International Edition 47.1 (2008): 58-77.

Walker et al., "Nanoscale Phase Separation and High Photovoltaic Efficiency in Solution-Processed, Small-Molecule Bulk Heterojunction Solar Cells." Advanced Functional Materials 19.19 (2009): 3063-3069.

Wienk et al., "Narrow-Bandgap Diketo-Pyrrolo-Pyrrole Polymer Solar Cells: The Effect of Processing on the Performance." Advanced Materials 20.13 (2008): 2556-2560.

Woo et al., "Incorporation of furan into low band-gap polymers for efficient solar cells." Journal of the American Chemical Society 132. 44 (2010): 15547-15549.

Yan et al., "A high-mobility electron-transporting polymer for printed transistors." Nature 457.7230 (2009): 679-686.

Yang et al., "Organic electronics: from materials to devices." Advanced Materials 21.14-15 (2009): 1401-1403.

Yu et al., "Polymer photovoltaic cells: enhanced efficiencies via a network of internal donor-acceptor heterojunctions." Science-AAAS-Weekly Paper Edition 270.5243 (1995): 1789-1790.

Zou et al., "A high-mobility low-bandgap poly (2, 7-carbazole) derivative for photovoltaic applications." Macromolecules 42.8 (2009): 2891-2894.

Zou et al., "Synthesis and characterization of new low-band gap diketopyrrolopyrrole-based copolymers." Macromolecules 42.17 (2009): 6361-6365.

* cited by examiner

| comp | $\lambda_{max}^{film}$ (nm) | $\lambda_{max}^{sol}$ (nm) | $\Delta E_{opt}^{film}$ (eV) | $\Delta E_{opt}^{sol}$ (eV) | HOMO (eV) | LUMO (eV) |
|---|---|---|---|---|---|---|
| DTBDPD-F | 706 | 682 | 1.53 | 1.48 | -5.13 | -3.78 |
| DTBDPD-Cz | 726 | 701 | 1.45 | 1.44 | -5.01 | -3.77 |
| DTBDPD-DTSi | 849 | 878 | 1.10 | 1.04 | -4.85* | -3.75 |
| DTBDPD-DPP | 967 | 1064 | 1.03 | 1.00 | -4.99* | -3.96 |
| BDPD-DPP | 1037 | 1108 | 0.82 | 0.75 | -4.89* | -4.07 |
| DTBDPD-DTPy | 1021 | 1006 | 0.84 | 0.81 | -4.62* | -3.78 |
| BDPD-T | 594 | 559 | 1.94 | 1.69 | -5.38 | -3.75 |
| BDPD-DiT | 683 | 617 | 1.61 | 1.56 | -4.96 | -3.76 |
| BDPD-TriT | 715 | 652 | 1.47 | 1.40 | -5.03 | -3.92 |

* Estimated from LUMO and $\Delta E_{opt}^{sol}$

*Figure 23*

BENZODIPYRROLIDONES AND THEIR POLYMERS: SYNTHESIS AND APPLICATIONS FOR ORGANIC ELECTRONICS AND OPTOELECTRONICS

CROSS REFERENCE TO RELATED APPLICATIONS

This application claims priority under 35 U.S.C. §119(e) of the following and commonly-assigned U.S. Provisional patent application:

U.S. Provisional Patent Application Ser. No. 61/621,561 entitled "BENZODIPYRROLIDONES AND THEIR POLYMERS: SYNTHESIS AND APPLICATIONS FOR ORGANIC ELECTRONICS AND OPTOELECTRONICS," filed on Apr. 8, 2012, by Weibin Cui and Fred Wudl;

which application is incorporated by reference herein.

BACKGROUND OF THE INVENTION

1. Field of the Invention

The invention relates to organic semiconductors contain benzodipyrrolidone unit. More particularly, to the synthesis of benzodipyrrolidone and their polymers and small molecules for electronic and optoelectronic applications.

2. Description of the Related Art (Note: This application references a number of different publications as indicated throughout the specification by one or more reference numbers within brackets, e.g., [x]. A list of these different publications ordered according to these reference numbers can be found below in the section entitled "References." Each of these publications is incorporated by reference herein.)

Conjugated semiconductors have received more and more attention due to their intriguing electronic and optoelectronic properties for application in a variety of optoelectronic devices, such as light-emitting diodes (LEDs)[1], organic thin film transistors (OTFTs)[2], and organic photovoltaics (OPVs)[3]. Such applications, inter alia, encourage the incessant exploration of conjugated semiconductors with new structures. In recent years, several organic colorants with specialized behavior in properties such as fluorescence, photoconduction, broad range absorption, and reversible redox, have been employed in organic electronics. One of the most successfully applied pigments is diketopyrrolopyrrole (DPP) with the underlying pyrolo[3,4-c]pyrrole-1,4-dione chromophoric system[4]. DPP has a planar, highly conjugated, lactam structure, resulting in strong π-π interactions and electron-withdrawing effects. During the last decade, it was shown that incorporation of DPP in polymers, oligomers and dendrimers resulted in emerging materials for optoelectronic applications, especially in organic thin film transistors (OTFTs)[5-9] and organic photovoltaic (OPVs). [10-13]

3,7-diphenyl-2,6-dioxo-1,2,5,6-tetrahydrobenzo[1,2-b:4, 5-b']dipyrrole (diphenylbenzodipyrrolidone) is a type of molecule originally prepared as a colorant and is similar in structure to DPP, but has the additional twist of being a quinodimethane derivative. Diphenylbenzodipyrrolidone can also be envisioned as a "stretched" DPP. Greenhalgh, C. W. et al, (Dyes and Pigments 1980, 1, 103-120) described the preparation of N,N'-dimethyl-3,7-diphenyl-2,6-dioxo-1,2,5, 6-tetrahydrobenzo[1,2-b:4,5-b']dipyrrole by condensation of N,N'-dimethyl-1,4-phenylenediamine with mandelic acid. Cui, W. B. et al, (Macromolecules 2011, 44, 7869-7873) described a modified method to make N,N'-dialkyl-3,7-diphenyl-2,6-dioxo-1,2,5,6-tetrahydrobenzo[1,2-b:4,5-b'] dipyrrole and make benzene and thiophene copolymers with N, N'-dioctyldodecyl-3,7-diphenyl-2,6-dioxo-1,2,5,6-tetrahydrobenzo[1,2-b:4,5-b']dipyrrole. The polymers were applied to organic thin film transistors. However, only diphenylbenzodipyrrolidone and its derivatives were successfully synthesized by the above procedure. Attempts to synthesize diarylbenzodipyrrolidone with aryl as non-phenyl aromatics or dihalobenzodipyrrolidones were all failed.

SUMMARY OF THE INVENTION

In one embodiment, a compound is provided comprising the following formula:

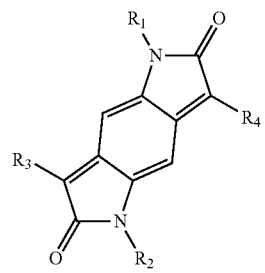

where $R_1$ and $R_2$ are or can be (e.g., independently) selected from a group comprising or consisting of any length alkyl chain unit, H, C1-C30 alkyl, —C(O)O—C1-C30 alkyl, perfluoro-C1-C30 alkyl, C5-C30 aryl or aryl with heteroatoms, $(CH2CH2O)_n$ (n=1~20), alkoxy, alkenyl group, alkynyl group, allyl group, cycloalkyl group, cycloalkenyl group, ketone or aldehyde group, ester group, carbamoyl group silyl group, siloxanyl group and any combination of thereof, $R_3$ and $R_4$ can be independently selected from Cl, Br, I, and any aromatic group, but where $R_3$ and $R_4$ cannot be, are different from, or do not contain, a phenyl and substituted phenyl group.

In an embodiment of paragraph [0008], $R_3$ and $R_4$ are or can be (e.g., independently) selected from any aromatic group consisting/comprising of more than 6 $sp^2$ carbon atoms and any heterocycle rings.

In another embodiment of paragraph [0008], $R_1$ and $R_2$ are or can be (e.g., independently) selected from a group consisting of any length alkyl chain unit, H, C1-C20 alkyl, —C(O) O—C1-C20 alkyl, perfluoro-C1-C20 alkyl, alkoxy, alkenyl group, alkynyl group, allyl group, cycloalkyl group, cycloalkenyl group, ketone or aldehyde group, ester group, carbamoyl group silyl group, siloxanyl group and any combination of thereof; and wherein $R_3$ and $R_4$ are or can be (e.g., independently) selected from any aromatic group disclosed in FIG. 22.

In one embodiment, a polymer is provided comprising the formula:

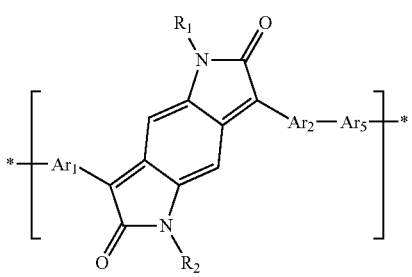

where $R_1$ and $R_2$ are or can be (e.g., independently) selected from a group consisting/comprising any length alkyl chain unit, H, C1-C30 alkyl, —C(O)O—C1-C30 alkyl, perfluoro-C1-C30 alkyl, C5-C30 aryl or aryl with heteroatoms, $(CH2CH2O)_n$ (n=1~20), alkoxy, alkenyl group, alkynyl group, allyl group, cycloalkyl group, cycloalkenyl group, ketone or aldehyde group, ester group, carbamoyl group silyl group, siloxanyl group and any combination of thereof, and $Ar_1$, $Ar_2$ and $Ar_5$ are or can be (e.g., independently) selected from any aromatic group.

In another embodiment of paragraph [0011], $Ar_1$, $Ar_2$ are or can be (e.g., independently) selected from any aromatic group consisting/comprising of more than 6 sp$^2$ carbon atoms and any heterocycle rings.

In another embodiment of paragraph [0011], the aromatic group is disclosed in FIG. 22.

In another embodiment of paragraph [0011], $Ar_1$ and $Ar_2$ cannot be, or are different from, or do not contain a phenyl and substituted phenyl group.

In one embodiment, a process for making a compound is provided, wherein the compound has the following structure:

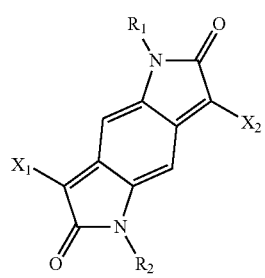

The process can comprise performing an elimination reaction to the following compound (D):

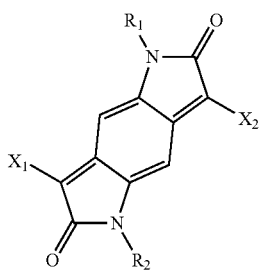

D where $R_1$ and $R_2$ are or can be (e.g., independently) selected from a group consisting/comprising of any length alkyl chain unit, H, C1-C30 alkyl, —C(O)O—C1-C30 alkyl, perfluoro-C1-C30 alkyl, C5-C30 aryl or aryl with heteroatoms, $(CH2CH2O)_n$ (n=1~20), alkoxy, alkenyl group, alkynyl group, allyl group, cycloalkyl group, cycloalkenyl group, ketone or aldehyde group, ester group, carbamoyl group silyl group, siloxanyl group and any combination of thereof, and $X_1$, and $X_2$ are or can be (e.g., independently) selected from, Cl, Br, I.

In one embodiment, a process for making a small molecule organic semiconductor containing one or more benzodipyrrolidone units is provided, comprising: coupling a compound with an aromatic unit; where the compound has the following structure:

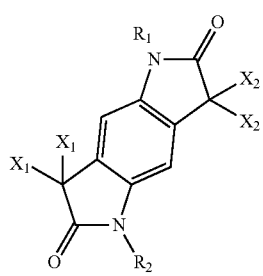

where $R_1$ and $R_2$ are or can be (e.g., independently) selected from any length alkyl chain unit, H, C1-C30 alkyl, —C(O)O—C1-C30 alkyl, perfluoro-C1-C30 alkyl, C5-C30 aryl or aryl with heteroatoms, $(CH2CH2O)_n$ (n=1~20), alkoxy, alkenyl group, alkynyl group, allyl group, cycloalkyl group, cycloalkenyl group, ketone or aldehyde group, ester group, carbamoyl group silyl group, siloxanyl group and any combination of thereof, and $X_1$, and $X_2$ are or can be (e.g., independently) selected from Cl, Br, and I.

In one embodiment, a process for making a polymer semiconductor containing one or more benzodipyrrolidone units is provided, comprising: coupling a compound with an aromatic unit; where the compound has the following structure:

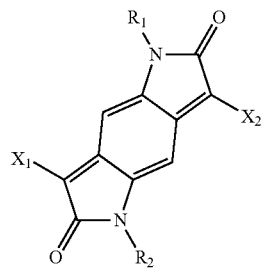

and where $R_1$ and $R_2$ are or can be (e.g., independently) selected from any length alkyl chain unit, H, C1-C30 alkyl, —C(O)O—C1-C30 alkyl, perfluoro-C1-C30 alkyl, C5-C30 aryl or aryl with heteroatoms, $(CH2CH2O)_n$ (n=1~20), alkoxy, alkenyl group, alkynyl group, allyl group, cycloalkyl group, cycloalkenyl group, ketone or aldehyde group, ester group, carbamoyl group silyl group, siloxanyl group and any combination of thereof, and $X_1$, and $X_2$ are or can be (e.g., independently) selected from Cl, Br, I. The process can further comprise performing polymerization reactions.

In one embodiment, a device is provided comprising a compound with the following structure:

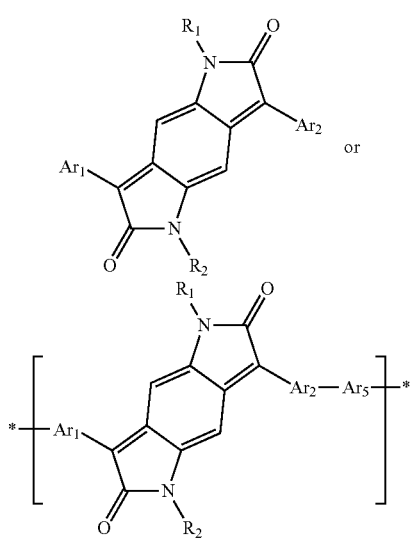

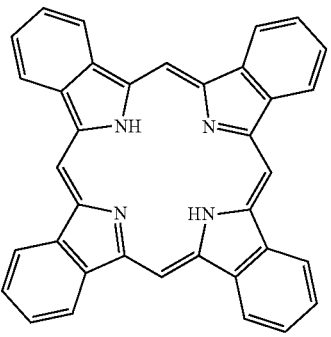

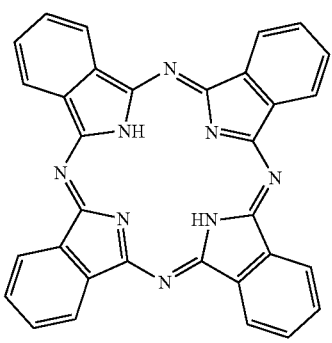

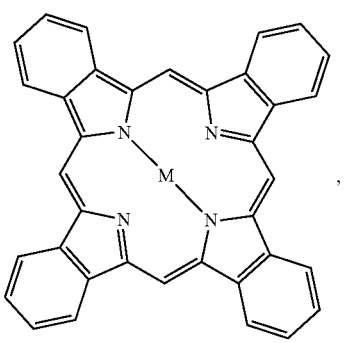

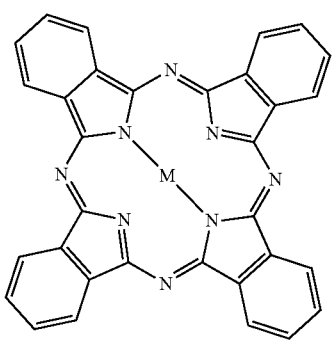

where $R_1$ and $R_2$ are or can be (e.g., independently) selected from any length alkyl chain unit, H, C1-C30 alkyl, —C(O)O—C1-C30 alkyl, perfluoro-C1-C30 alkyl, C5-C30 aryl or aryl with heteroatoms, $(CH2CH2O)_n$ (n=1~20), alkoxy, alkenyl group, alkynyl group, allyl group, cycloalkyl group, cycloalkenyl group, ketone or aldehyde group, ester group, carbamoyl group silyl group, siloxanyl group and any combination of thereof, and $Ar_1$ $Ar_2$ and $Ar_5$ are or can be (e.g., independently) selected from any aromatic group.

In another embodiment of paragraph [0018], the device is selected from a group consisting of light-emitting diodes, organic thin film transistors, and organic photovoltaic cells.

In one embodiment, a photovoltaic cell is provided comprising an electron donor and an electron acceptor, wherein the following compounds

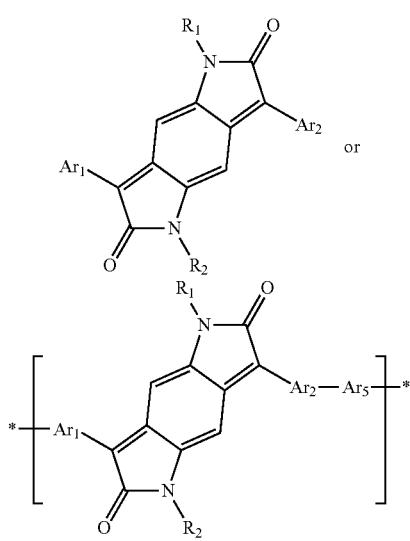

are the electron acceptor in a photoactive layer of said device.

In another embodiment of paragraph [0020], the electron donor is a tetrabenzoporphyrin with formula I, or a phthalocyanine with formula II, or a metal containing tetrabenzoporphyrin with formula III, or a metal containing phthalocyanine with formula IV, or their derivatives; wherein M is or can be selected from, but not limited to, Cu, Zn, Ti, Al, In. Formulas I-IV are illustrated below:

In one embodiment, a photovoltaic cell is provided comprising an electron donor and an electron acceptor, wherein the following compounds:

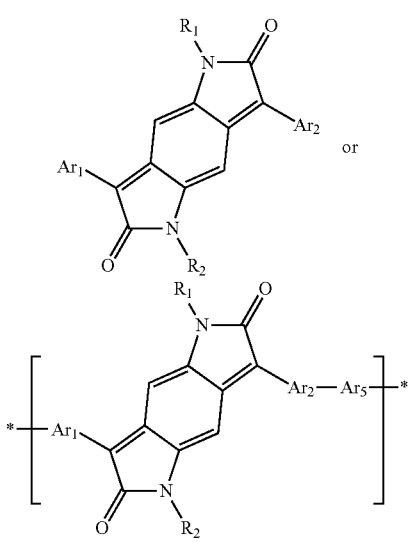

are the electron donor in the photoactive layer of said device.

In one embodiment of paragraph [0022], the electron acceptor is a fullerene with LUMO level lower than PCBM and/or the electron acceptor is a fullerene substituted with electron-withdrawing groups, the electron-withdrawing groups are or can be, but are not limited to, CN, F, Cl, $NO_2$, $SO_3R$, $PO_3R$.

In one embodiment, the photovoltaic cell of paragraph [0022], the electron acceptor is a fullerene with the following structure:

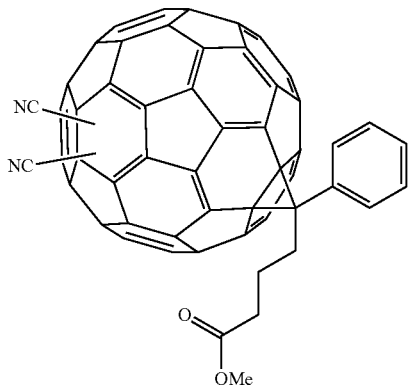

BRIEF DESCRIPTION OF THE DRAWINGS

For a more complete understanding of the present invention, reference is now made to the following descriptions taken in conjunction with the accompanying drawings, in which like reference numbers represents corresponding parts throughout:

FIG. 23 shows some estimated Lowest Unoccupied Molecular Orbital (LUMO) levels of some disclosed compounds, wherein $\Delta E_{opt}^{sol}$ is the bandgap estimated from optical absorption of the compounds in solution and HOMO is the highest occupied molecular orbital.

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Technical Description

Figure 1A:
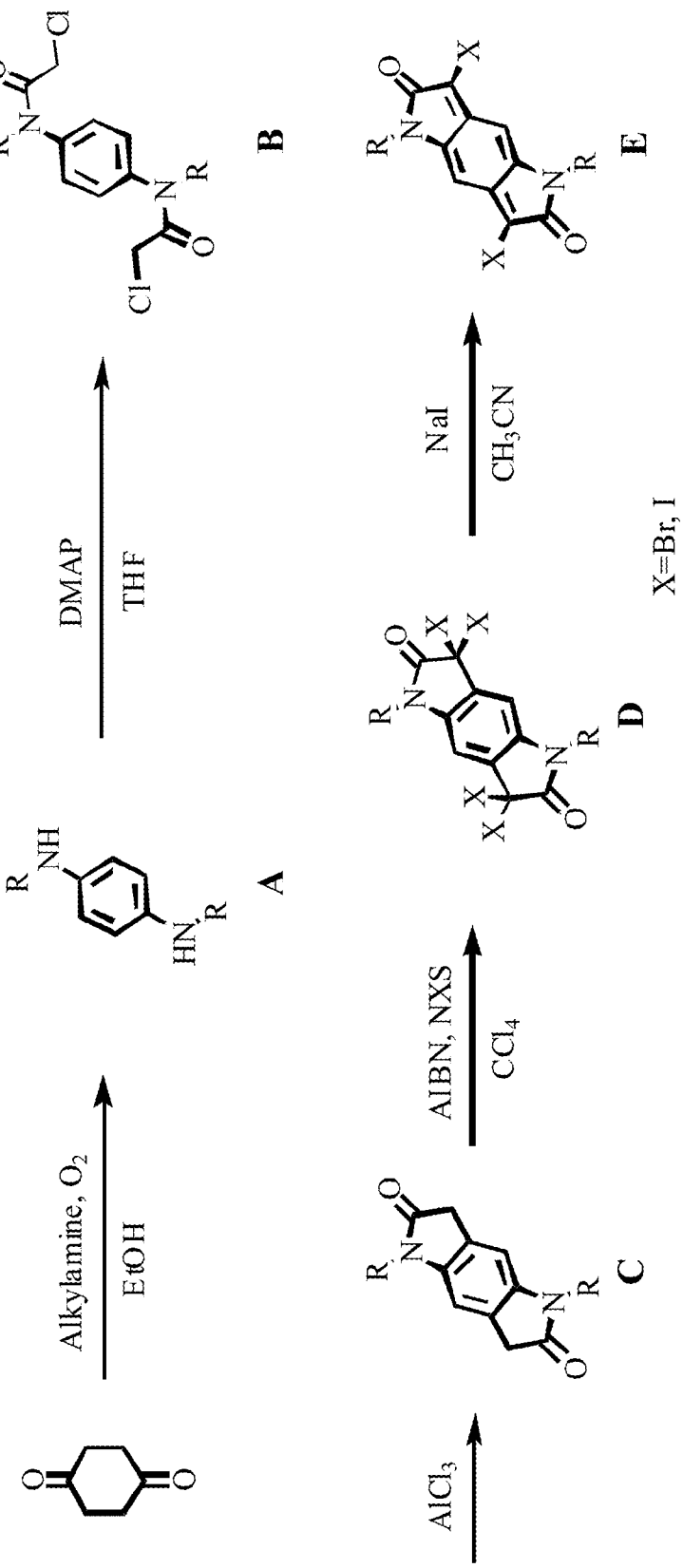
FIG. 1(a) shows Scheme 1. One embodiment of a novel synthetic route of dihalo benzodipyrrolidone.

In the current work, we successfully developed a new method to directly prepare the benzodipyrrolidone and dihalobenzodipyrrolidones (compound E) as shown in FIG. 1(a). The new method make it possible to make small molecule semiconductors containing benzodipyrrolidone structure (formula I) by reacting compound E with various of functionalized aromatics (alkene, alkyne, benzene, thiophene, furan etc.). The dihalobenzodipyrrolidones can be self-polymerized or copolymerized with other aromatic monomers to make a broad range of conjugated polymers. Small molecules with a structure of formula I with reacting sites on $Ar_1$ and $Ar_2$ can be used as monomers to produce conjugated polymers too. Polymer and small molecule semiconductors contain benzodipyrrolidone units have potential applications in organic light-emitting diodes (OLEDs), organic thin film transistors (OTFTs), organic photovoltaics (OPVs), organic sensors and other organic electronic devices.

In one embodiment, the present invention discloses a composition of matter, comprising a compound having/comprising the following formula:

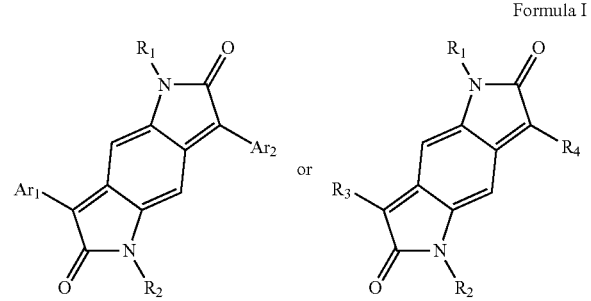

Formula I

Figure 22:
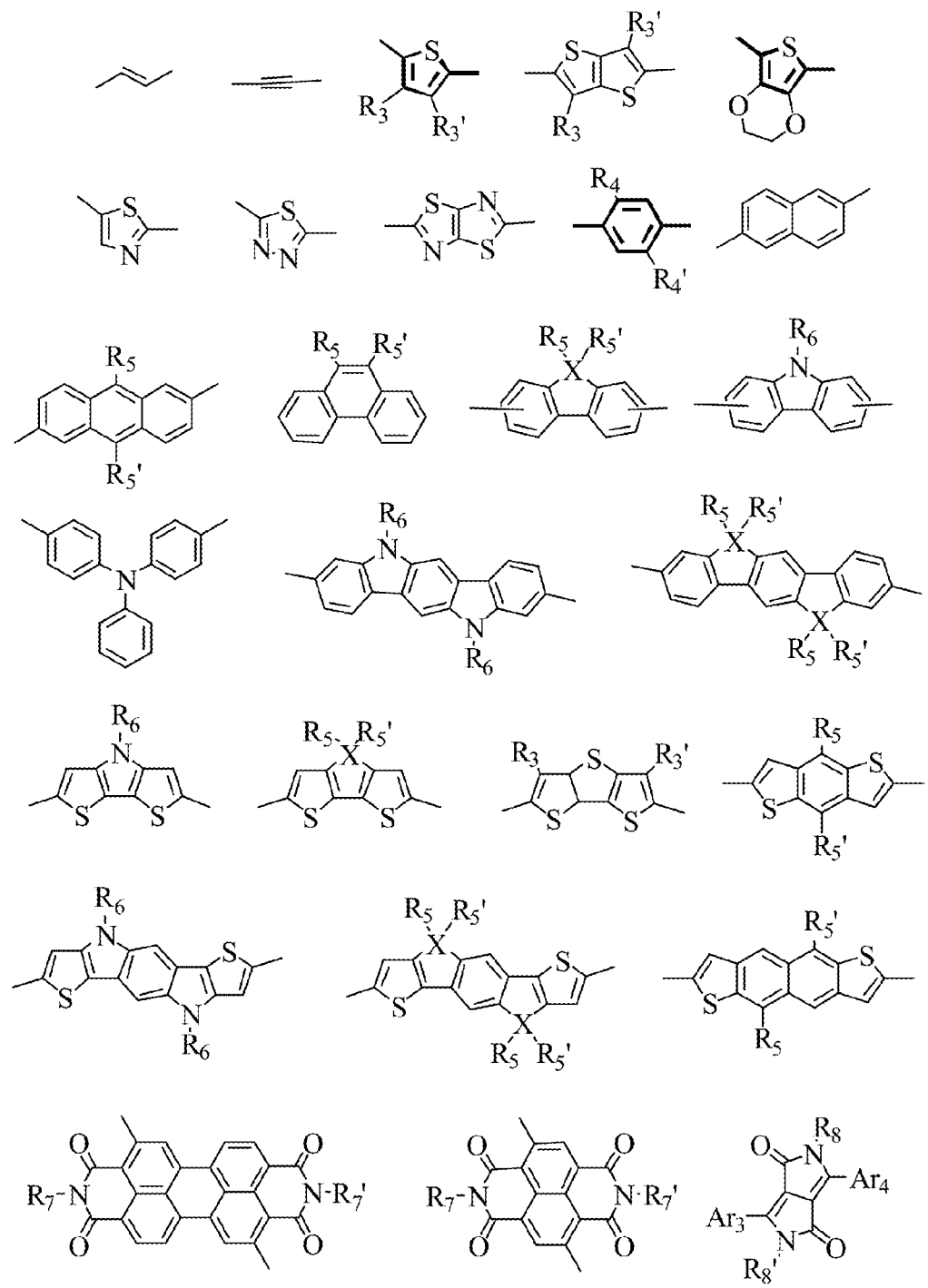
FIG. 22 shows possible groups that can be $Ar_1$ and $Ar_2$ in formula I.

In one embodiment, $R_1$ and $R_2$ can independently be any be any length alkyl chain unit not limited to H, C1-C20 alkyl, —C(O)O—C1-C20 alkyl, perfluoro-C1-C20 alkyl, alkoxy, alkenyl group, alkynyl group, allyl group, cycloalkyl group, cycloalkenyl group, ketone or aldehyde group, ester group, carbamoyl group silyl group, or siloxanyl group; and $Ar_1$ and $Ar_2$ can be independently any aromatic unit not limited to those disclosed in FIG. 22.

In one embodiment, $R_1$ and $R_2$ can be independently selected from a group consisting/comprising of H, C1-C30 alkyl, —C(O)O—C1-C30 alkyl, perfluoro-C1-C30 alkyl, $C_5$-C30 aryl or aryl with heteroatoms, $(CH2CH2O)_n$ (n=1~20), alkoxy, alkenyl group, alkynyl group, allyl group, cycloalkyl group, cycloalkenyl group, ketone or aldehyde group, ester group, carbamoyl group silyl group, siloxanyl group and any combination of thereof.

In one embodiment, $R_3$ and $R_4$ can be independently selected from halogens, Cl, Br, I, and any aromatic group, but where $R_3$ and $R_4$ cannot be a phenyl and substituted phenyl group.

In one embodiment, $R_3$ and $R_4$ can be independently selected from any aromatic group consisting of more than 6 $sp^2$ carbon atoms and any heterocycle rings.

In one embodiment, $Ar_1$ and $Ar_2$ are any aromatic units and $R_3$ and $R_4$ are halogens, and the compounds with $Ar_1$ and $Ar_2$ are any non-phenyl aromatics.

A new method was developed for the preparation of benzodipyrrolidone, as illustrated in FIG. 1(a). In one embodiment, benzodipyrrolidones can be prepared first by condensation of 1,4-cyclohexanedione with amine in the presence of air to afford N,N'-Dialkyl-benzene-1,4-diamines (A), followed by amidation reaction give acetamide B. Then, a ring-closure reaction was performed in melting $AlCl_3$ to afford C. After halogenation of compound C to produce compound D and reduction dehalogenation of compound D, main intermediate dihalogenbenzodipyrrolidones (E) were obtained.

Both small molecules of formula I and polymers comprising of formula II (below) can be prepared by means of metal-catalyzed cross-coupling reactions.

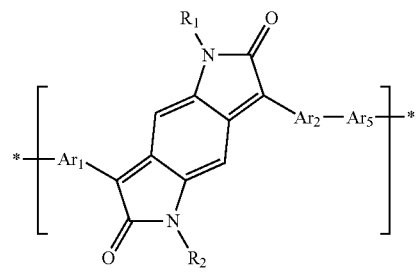

Formula II

Above is a generic structure of benzodipyrrolidone polymers that can be made with the disclosed process.

In one embodiment, $R_1$ and $R_2$ can independently be any length alkyl chain unit not limited to H, C1-C20 alkyl, —C(O)O—C1-C20 alkyl, perfluoro-C1-C20 alkyl, alkoxy, alkenyl group, alkynyl group, allyl group, cycloalkyl group, cycloalkenyl group, ketone or aldehyde group, ester group, carbamoyl group silyl group, and siloxanyl group; and $Ar_1$, $Ar_2$ and $Ar_5$ can independently be an aromatic unit or group, e.g., not limited to each of the following in FIG. 22.

In one embodiment, $R_1$ and $R_2$ can independently be H, C1-C30 alkyl, —C(O)O—C1-C30 alkyl, perfluoro-C1-C30 alkyl, C5-C30 aryl or aryl with heteroatoms, $(CH2CH2O)_n$ (n=1~20), alkoxy, alkenyl group, alkynyl group, allyl group, cycloalkyl group, cycloalkenyl group, ketone or aldehyde group, ester group, carbamoyl group silyl group, siloxanyl group and any combination of thereof.

In one embodiment, $A_{R1}$ and $A_{R2}$ cannot be a phenyl and substituted phenyl group.

In one embodiment, $AR_1$ and $AR_2$ can be independently selected from any aromatic group consisting of more than 6 $sp^2$ carbon atoms and any heterocycle rings.

Process Steps

Examples 1-5 below are examples of a process, illustrated in FIG. 1(a)-1(b), for making a composition of matter.

Figure 1B:
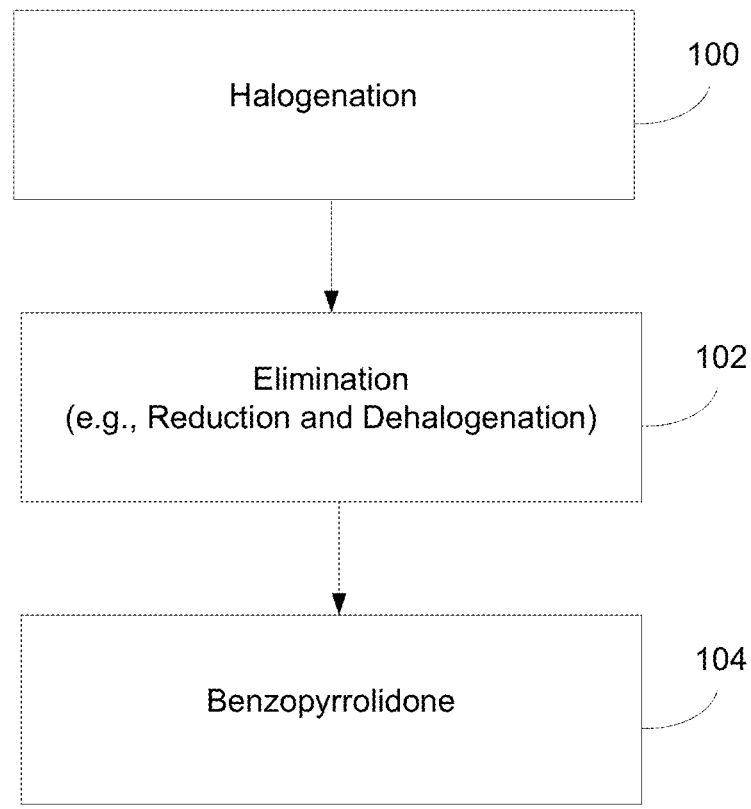
FIG. 1(b) is a flowchart illustrating a method of fabricating a compound according to one or more embodiments of the invention.

Block 100 of FIG. 1(b) illustrates the process can comprise a halogenation step (e.g., halogenation of intermediate compound C) to obtain the compound (D).

Block 102 of FIG. 1(b) illustrates the process can comprise performing an elimination (e.g. reduction and dehalogenation) reaction on the following compound (D):

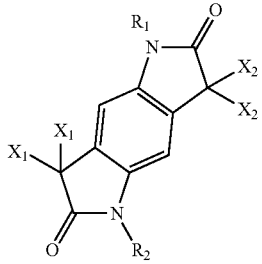

Block 104 of FIG. 1(b) illustrates the composition of matter comprising a benzodipyrrolidone compound or compound X made using the steps of Block 102 and 104, and having the following structure:

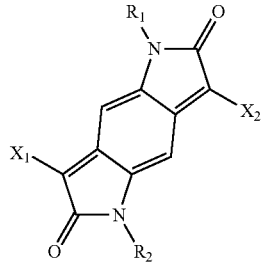

where $R_1$ and $R_2$ can be independently selected from any length alkyl chain unit, H, C1-C30 alkyl, —C(O)O—C1-C30 alkyl, perfluoro-C1-C30 alkyl, C5-C30 aryl or aryl with heteroatoms, $(CH2CH2O)_n$ (n=1~20), alkoxy, alkenyl group, alkynyl group, allyl group, cycloalkyl group, cycloalkenyl group, ketone or aldehyde group, ester group, carbamoyl group silyl group, siloxanyl group and any combination of thereof, and $X_1$, and $X_2$ can be independently selected from Cl, Br, I or other halogens.

EXAMPLE 1

For Preparation of Compound A (See FIG. 1(a))

E.g., preparation of N,N'-Dihexyl-benzene-1,4-diamine: To a solution of cyclohexane-1,4-dione (5.60 g, 50.0 mmol) in ethanol (500 mL) was added hexylamine (10.1 g, 100 mmol). The resulting mixture was stirred under bobbling air for 4 hours (h). Solvent was removed under reduced pressure. The residue was purified by column chromatography on silica gel with hexane: DCM: ethyl acetate=10:10:1 as eluent to yield a light yellow solid (8.50 g, 61.5%). $^1$H NMR (CDCl$_3$, 600 MHz) δ ppm 6.58 (br, 4H), 3.05 (br, 4H), 1.59 (br, 4H), 1.31-1.38 (m, 12H), 0.88-0.92 (m, 6H). $^{13}$C NMR (CDCl$_3$, 600 MHz) δ ppm 140.96, 114.74, 45.42, 31.70, 29.78, 26.91, 22.63, 14.03.

EXAMPLE 2

For Preparation of Compound B (see FIG. 1(a))

E.g., preparation of N,N'-1,4-Phenylenebis[2-chloro-N-hexyl]acetamide: To a solution of chloroacetylchloride (0.402 g, 3.56 mmol) in THF (5 mL) at 0° C. was added a solution of N,N'-dihexyl-benzene-1,4-diamine (0.300 g, 1.19 mmol) and 4-(dimethylamino)pyridine (DMAP) (0.135 g, 1.11 mmol) in THF (10 mL) dropwise. After 1 h, the reaction mixture was quenched with water. The precipitate was collected by filtration. After being washed with water and methanol, the solid was dried in vacuo to yield a white solid (0.37 g, 72.5%). $^1$H NMR (CDCl$_3$, 600 MHz) δ ppm 7.32 (s, 4H), 3.82 (s, 4H), 3.27 (t, J=7.8 Hz, 4H), 1.53-1.55 (m, 4H), 1.26-1.32 (m, 12H), 0.87-0.88 (m, 6H). $^{13}$C NMR (CDCl$_3$, 600 MHz) δ ppm 165.64, 141.51, 129.65, 50.21, 41.73, 31.41, 27.51, 26.31, 22.49, 13.95.

EXAMPLE 3

For Preparation of Compound C (See FIG. 1(a))

E.g., preparation of 1,5-Dihexyl-5,7-dihydro-1H,3H-pyrrolo[2,3-f]indole-2,6-dione: A mixture of N,N'-1,4-phenylenebis[2-chloro-N-hexyl]acetamide (5.00 g, 11.6 mmol) and anhydrous aluminum chloride (10.8 g, 81.5 mmol) was heated at 190° C. for 20 min. After cooling, cracked ice was added to quench the reaction. The precipitate formed was collected by filtration. After being washed with water and methanol, the solid was dried and further purified by column chromatography on silica gel with DCM:ethyl acetate=10:1 as eluent to yield a white solid (2.88 g, 70%). $^1$H NMR (CDCl$_3$, 600 MHz) δ ppm 6.77 (s, 2H), 3.65-3.69 (m, 4H), 3.54-3.55 (m, 4H), 1.64-1.67 (m, 4H), 1.25-1.65 (m, 12H), 0.87-0.89 (m, 6H).

EXAMPLE 4

For Preparation of Compound D (see FIG. 1(a))

E.g., preparation of 3,3,7,7-Tetrabromo-1,5-dihexyl-5,7-dihydro-1H,3H-pyrrolo[2,3-f]indole-2,6-dione: To a mixture of 1,5-dihexyl-5,7-dihydro-1H,3H-pyrrolo[2,3-f]indole-2,6-dione (2.88 g, 8.08 mmol), AIBN (0.264 g, 1.62 mmol), and N-Bromosuccinimide (NBS) (8.63 g, 48.5 mmol), was added carbon tetrachloride (20 mL). The resulting mixture was heated at reflux for 12 h. After cooling, the mixture was washed with brine and dried over anhydrous MgSO$_4$. On removal of solvent, the residue was purified by column chromatography on silica gel with hexane:DCM=1:2 as eluent to yield a yellow solid (3.12 g, 57%). $^1$H NMR (CDCl$_3$, 600 MHz) δ ppm 7.07 (s, 2H), 3.75-3.81 (m, 4H), 1.72-1.77 (m, 4H), 1.26-1.62 (m, 12H), 0.88-0.92 (m, 6H).

EXAMPLE 5

For Preparation of Compound E (see FIG. 1(a))

E.g., preparation of 3,7-Dibromo-1,5-dihexyl-1H,5H-pyrrolo[2,3-f]indole-2,6-dione: To a suspension of 3,3,7,7-tetrabromo-1,5-dihexyl-5,7-dihydro-1H,3H-pyrrolo[2,3-f]indole-2,6-dione (3.00 g, 4.46 mmol) in CH$_3$CN (100 mL) was added sodium iodine (2.00 g, 13.4 mmol). The resulting mixture was stirred at room temperature for 30 minutes (min). After the solvent being removed under reduced pressure, the residue was dissolved in dichloromethane (DCM). The solution was washed with sodium thiosulfate aq. and water, dried over anhydrous MgSO$_4$. On removal the solvent, the residue was purified by column chromatography on silica gel with hexane:DCM=1:2 as eluent to yield a dark purple solid. (2.00 g, 87.7%). $^1$H NMR (CDCl$_3$, 600 MHz) δ ppm 5.90 (s, 2H), 3.58-3.64 (m, 4H), 1.58-1.64 (m, 4H), 1.21-1.54 (m, 12H), 0.88-0.91 (m, 6H).

EXAMPLE 6

For Preparation of Dithienylbenzodipyrrolidone 1,5-Dihexyl-3,7-di-thiophen-2-yl-1H,5H-pyrrolo[2,3-f]indole-2,6-dione. A mixture of 3,7-dibromo-1,5-dihexyl-1H,5H-pyrrolo[2,3-f]indole-2,6-dion (1.00 g, 1.95 mmol), 2-(Tributylstannyl)thiophene (1.60 g, 4.29 mmol), Pd(PPh$_3$)$_4$ (60 mg) and toluene (20 mL) was heated at reflux for 24 h. After cooling to room temperature, the reaction mixture was poured into water and extracted with toluene. The organic layer was washed with potassium fluoride aq. and brine, and then dried over anhydrous MgSO$_4$. On removal of the solvent, the residue was purified by column chromatography on silica gel with hexane: DCM=1:1 as eluent to yield a dark purple solid (0.70 g, 70%) with golden reflection. $^1$H NMR (CDCl$_3$, 600 MHz) δ ppm 7.99-8.00 (m, 2H), 7.52 (d, J=4.8 Hz, 2H), 7.18-7.19 (m, 2H), 6.55-6.56 (m, 2H), 3.65-3.69 (m, 4H), 1.68-1.73 (m, 4H), 1.26-1.63 (m, 12H), 0.88-0.93 (m, 6H).

EXAMPLE 7

For Bromination of Dithienylbenzodipyrrolidone

E.g., preparation of 1,5-Dihexyl-3,7-di-(5-bromothiophen-2-yl)-1H,5H-pyrrolo[2,3-f]indole-2,6-dione:
To a solution of 1,5-dihexyl-3,7-di-thiophen-2-yl-1H,5H-pyrrolo[2,3-f]indole-2,6-dione (0.275 g, 0.530 mmol) in Tetrahydrofuran (THF) (50 mL) was added NBS (0.250 g, 1.40 mmol) portionwise. The resulting mixture was stirred at room temperature overnight. To the resulting mixture methanol was added. The precipitate was collected, washed with methanol and dried in vacuo to yield a dark purple solid (0.300 g, 84.0%) with golden reflection. $^1$H NMR (CDCl$_3$, 600 MHz) δ ppm 7.68 (m, 2H), 7.14 (d, J=3.6 Hz, 2H), 6.42 (m, 2H), 3.64-3.69 (m, 4H), 1.63-1.69 (m, 4H), 1.26-1.62 (m, 12H), 0.88-0.93 (m, 6H).

Small Molecules

Examples 8-12 are examples of a process for making a composition of matter comprising a small molecule organic semiconductor containing one or more benzodipyrrolidone units. The process comprises coupling a compound with an aromatic unit, where the compound has the following structure:

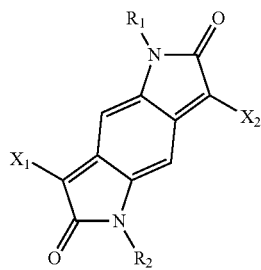

where R$_1$ and R$_2$ can be independently selected from any length alkyl chain unit and X$_1$, and X$_2$ can be independently selected from Cl, Br, and I.

EXAMPLE 8

Figure 2:
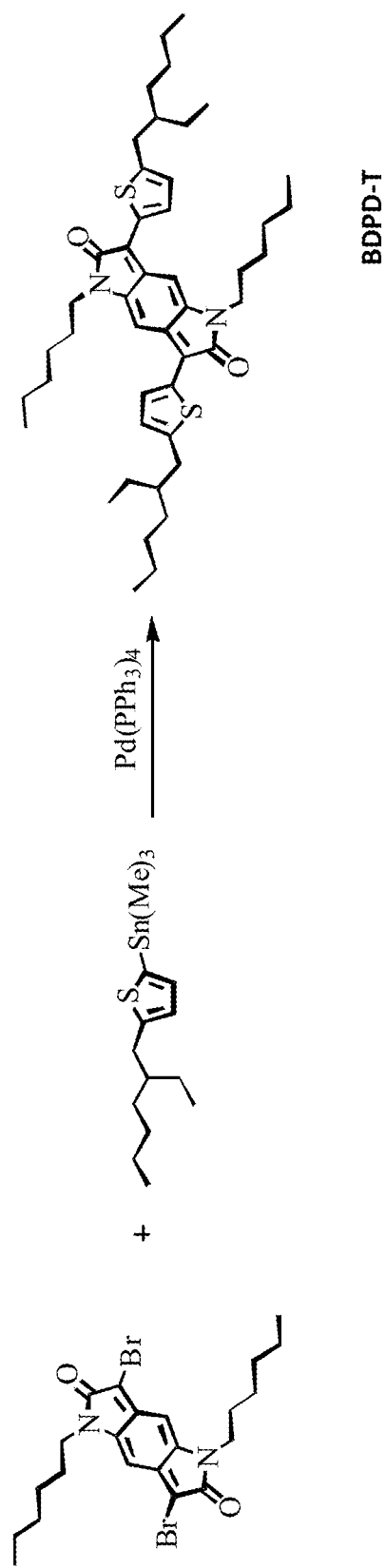
FIG. 2 shows a scheme for synthesis of benzodipyrrolidone-thiophene small molecule (example 8).

Small Molecule of Benzodipyrrolidone with Thiophene (See FIG. 2)

A mixture of 3,7-dibromo-1,5-dihexyl-1H,5H-pyrrolo[2,3-f]indole-2,6-dione (0.150 g, 0.293 mmol), 2-(trimethylstannyl)-5-ethylhexylthiophene (0.263 g, 0.732 mmol), Pd(PPh$_3$)$_4$ (20 mg) and toluene (10 mL) was heated at reflux for 24 h. After cooling to room temperature, the reaction mixture was poured into water and extracted with toluene. The organic layer was washed with potassium fluoride aq. and brine, and then dried over anhydrous MgSO$_4$. On removal of the solvent, the residue was purified by column chromatography on silica gel with hexane:dichloromethane 1:1 as eluent to yield a dark purple solid (0.14 g, 64%).

EXAMPLE 9

Figure 3:
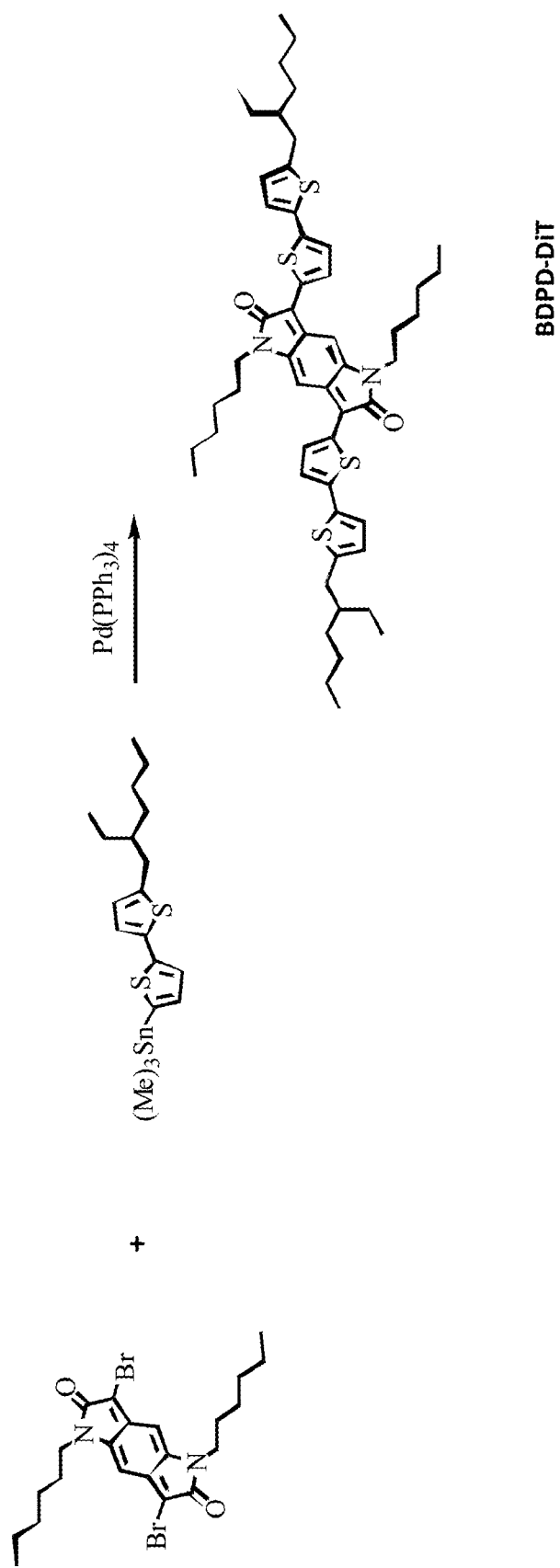
FIG. 3 shows a scheme for synthesis of benzodipyrrolidone-dithiophene small molecule (example 9).

Small Molecule of Benzodipyrrolidone with Dithiophene (See FIG. 3)

A mixture of 3,7-dibromo-1,5-dihexyl-1H,5H-pyrrolo[2,3-f]indole-2,6-dione (0.150 g, 0.293 mmol), (5'-(2-ethylhexyl)[2,2'-bithiophen]-5-yl)trimethylstannane (0.323 g, 0.732 mmol), Pd(PPh$_3$)$_4$ (20 mg) and toluene (15 mL) was heated at reflux for 24 h. After cooling to room temperature, the reaction mixture was poured into water and extracted with toluene. The organic layer was washed with potassium fluoride aq. and brine, and then dried over anhydrous MgSO$_4$. On removal of the solvent, the residue was purified by column chromatography on silica gel with hexane: dichloromethane=1:1 as eluent to yield a dark blue solid (0.17 g, 64.2%).

EXAMPLE 10

Figure 4:
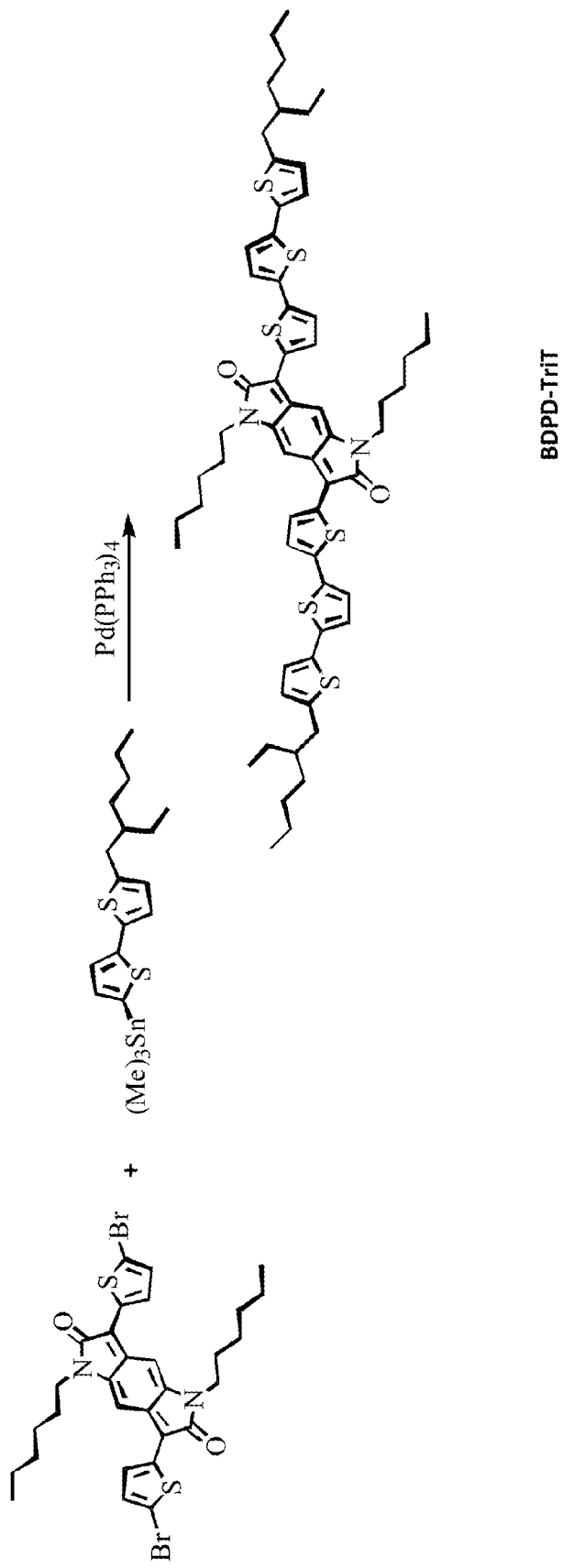
FIG. 4 shows a scheme for synthesis of benzodipyrrolidone-trithiophene small molecule (example 10).

Small Molecule of Benzodipyrrolidone with Trithiophene (See FIG. 4)

A mixture of 1,5-dihexyl-3,7-di-(5-bromothiophen-2-yl)-1H,5H-pyrrolo[2,3-f]indole-2,6-dione (0.150 g, 0.222 mmol), (5'-(2-ethylhexyl)[2,2'-bithiophen]-5-yl)trimethylstannane (0.293 g, 0.665 mmol), Pd(PPh$_3$)$_4$ (20 mg) and toluene (15 mL) was heated at reflux for 24 h. After cooling to room temperature, the reaction mixture was poured into water and extracted with toluene. The organic layer was washed with potassium fluoride aq. and brine, and then dried over anhydrous MgSO$_4$. On removal of the solvent, the residue was purified by column chromatography on silica gel with hexane: dichloromethane=1:1 as eluent to yield a black solid (0.13 g, 55%).

EXAMPLE 11

Figure 5:
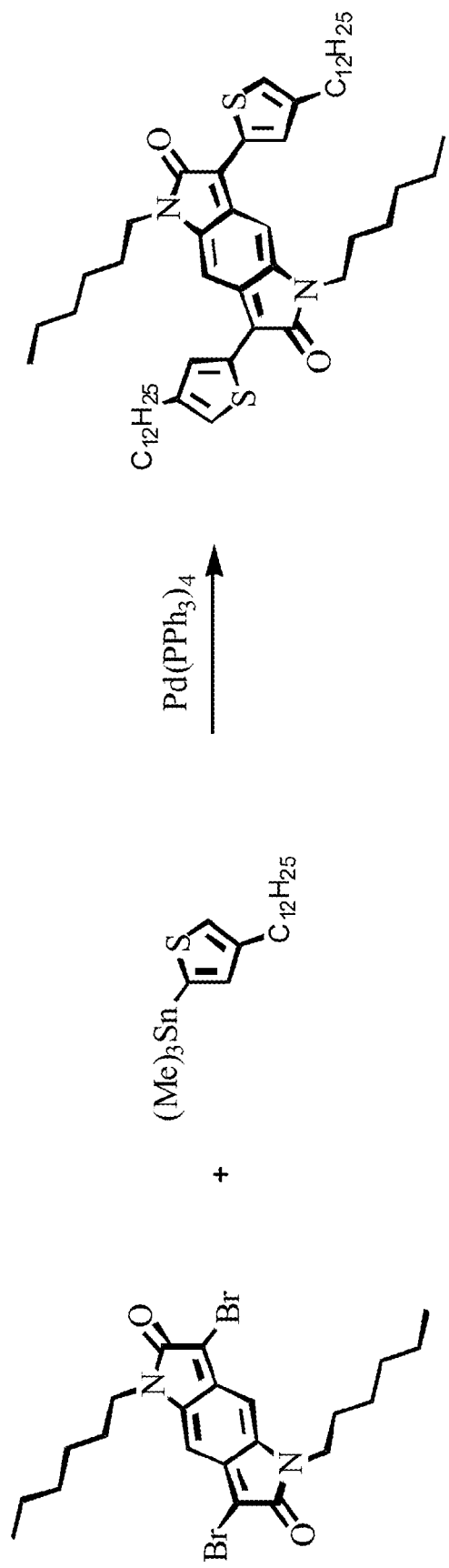
FIG. 5 shows a scheme for synthesis of benzodipyrrolidone-3-dodecylthiophene small molecule (example 11).

Small Molecule of Benzodipyrrolidone with 3-Dodecylthiophene (See FIG. 5)

A mixture of 3,7-dibromo-1,5-dihexyl-1H,5H-pyrrolo[2,3-f]indole-2,6-dione (0.510 g, 0.998 mmol), 2-(trimethylstannyl)-4-dodecylthiophene (0.913 g, 2.20 mmol), Pd(PPh$_3$)$_4$ (60 mg) and toluene (10 mL) was heated at reflux for 24 h. After cooling to room temperature, the reaction mixture was dropped into methanol to precipitate. A dark purple solid (0.72 g, 84.6%) was obtained.

EXAMPLE 12

Figure 6:
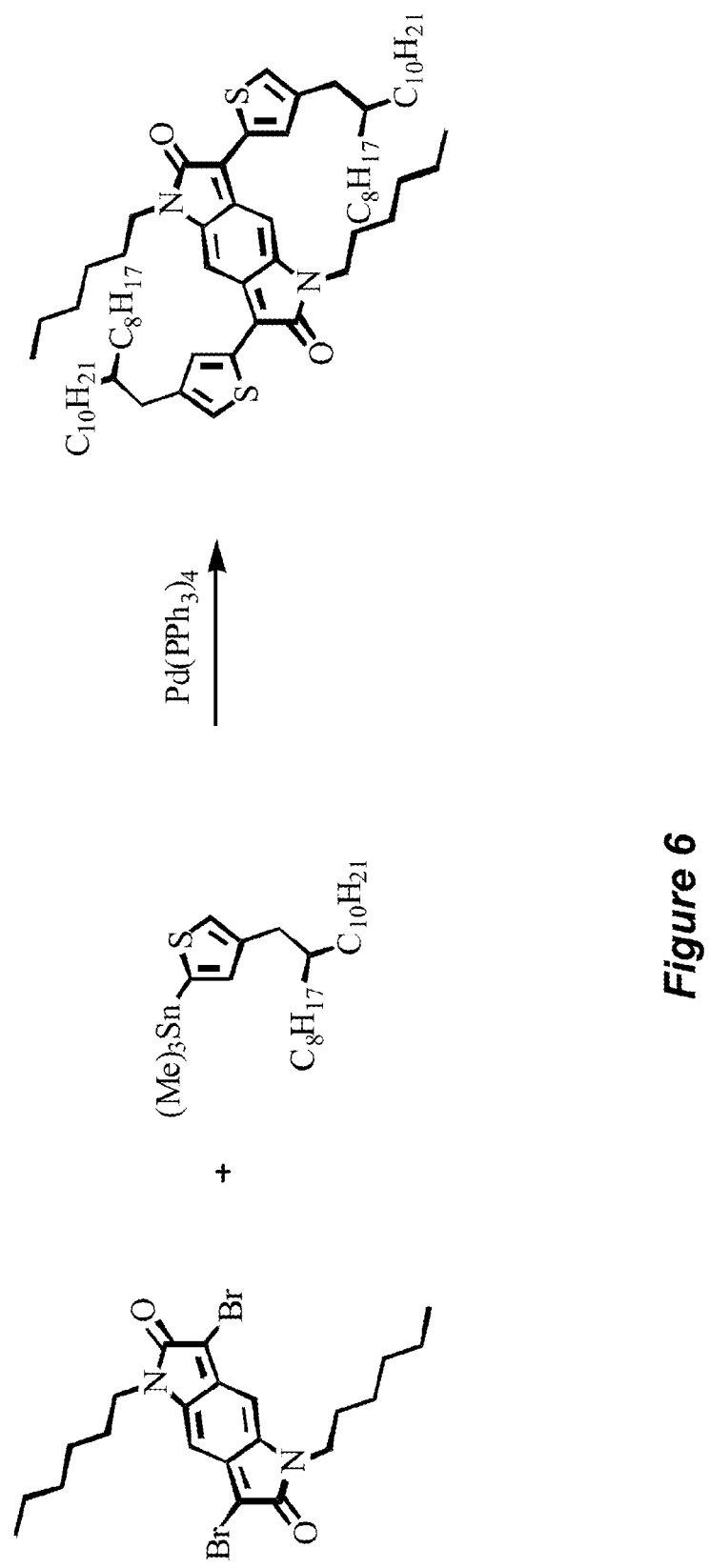
FIG. 6 shows a scheme for synthesis of benzodipyrrolidone-3-(2-octyldodecyl)thiophene small molecule (example 12).

Small Molecule of Benzodipyrrolidone with 3-(2-octyldodecyl)thiophene (see FIG. 6)

A mixture of 3,7-dibromo-1,5-dihexyl-1H,5H-pyrrolo[2,3-f]indole-2,6-dione (0.512 g, 1.00 mmol), trimethyl[4-(2-octyldodecyl)-2-thienyl]stannane, (1.32 g, 2.50 mmol), Pd(PPh$_3$)$_4$ (60 mg) and toluene (30 mL) was heated at reflux for 24 h. After cooling to room temperature, the reaction mixture was poured into water and extracted with toluene. The organic layer was washed with potassium fluoride aq. and brine, and then dried over anhydrous MgSO$_4$. On removal of the solvent, the residue was purified by column chromatography on silica gel with hexane: dichloromethane=1:1 as eluent to yield a dark purple solid (0.75 g, 69.4%).

EXAMPLE 13

Figure 7:
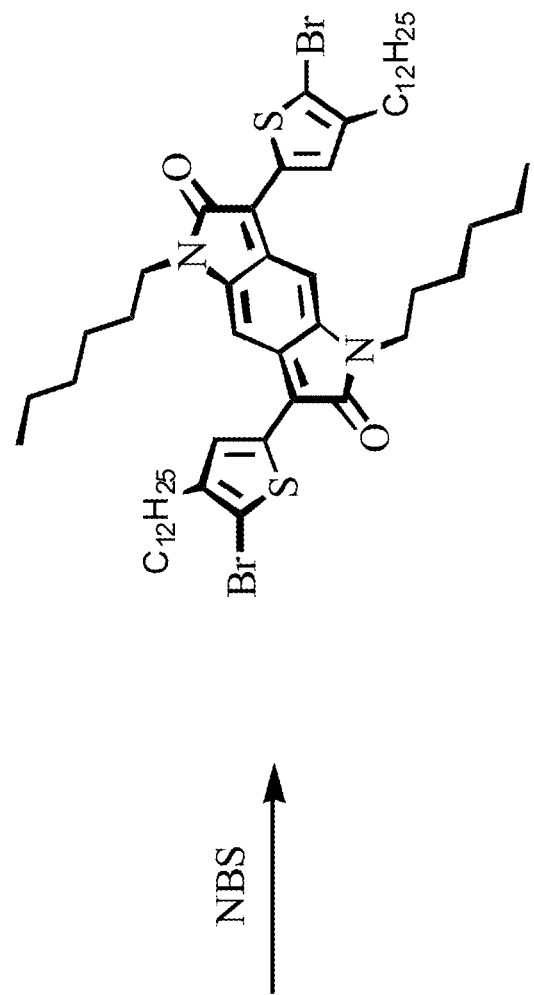
FIG. 7 shows a scheme for synthesis of dibromo-benzodipyrrolidone-3-dodecylthiophene small molecule (example 13).
Figure 7:
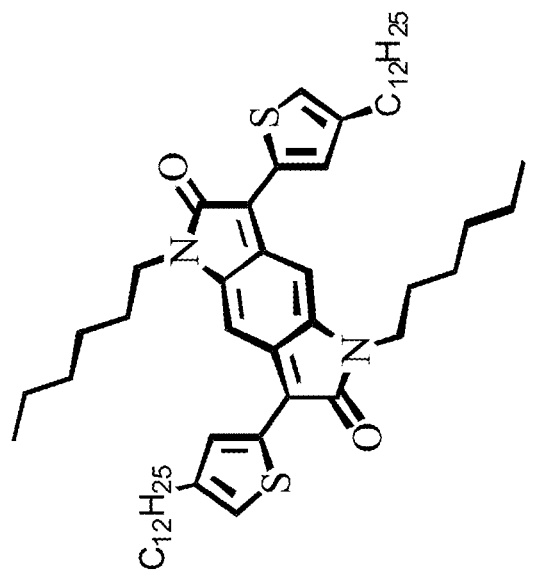

Bromination (see FIG. 7)

To a solution of 1,5-dihexyl-3,7-di-(3-dodecyl)thiophen-2-yl-1H,5H-pyrrolo[2,3-f]indole-2,6-dione (0.500 g, 0.585 mmol) in THF (30 mL) was added NBS (0.213 g, 1.20 mmol) portionwise. The resulting mixture was stirred at room temperature overnight. To the resulting mixture methanol was added. The precipitate was collected, washed with methanol and dried in vacuo to yield a dark purple solid (0.593 g, 92.7%).

EXAMPLE 14

Figure 8:
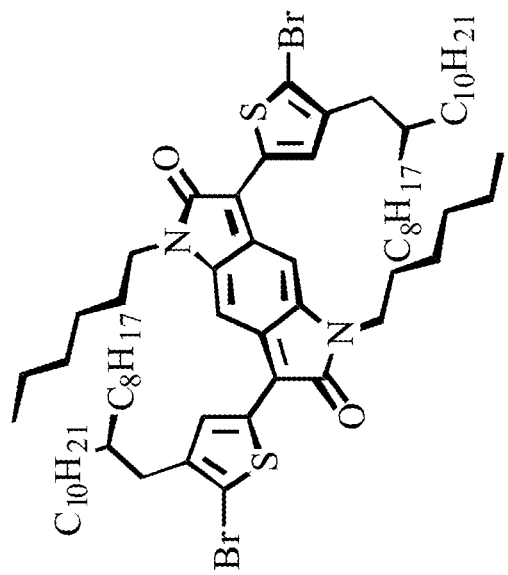
FIG. 8 shows a scheme for synthesis of dibromo-benzodipyrrolidone-3-(2-octyldodecyl)thiophene small molecule (example 14).
Figure 8:
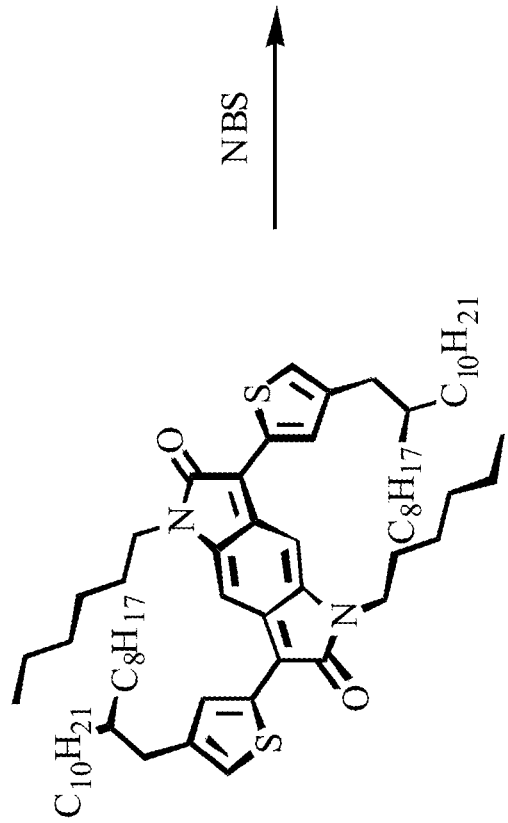

Bromination (see FIG. 8)

To a solution of 1,5-dihexyl-3,7-di-(3-(2-octyldodecyl))thiophen-2-yl-1H,5H-pyrrolo[2,3-f]indole-2,6-dione (0.500 g, 0.463 mmol) in THF (20 mL) was added NBS (0.173 g, 0.972 mmol) portionwise. The resulting mixture was stirred at room temperature overnight. To the resulting mixture methanol was added. The precipitate was collected, washed with methanol and dried in vacuo to yield a dark purple solid (0.487 g, 85%).

Polymerization

Examples 15-25 are examples of a process for making a composition of matter comprising a polymer semiconductor containing one or more benzodipyrrolidone units, comprising coupling a compound with an aromatic unit, where the compound has the following structure:

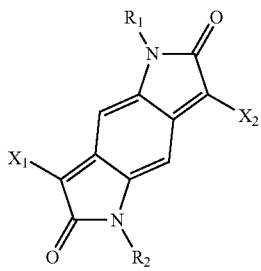

and where R$_1$ and R$_2$ can be independently selected from any length alkyl chain unit and X$_1$, and X$_2$ can be independently selected from Cl, Br, I; and performing polymerization reactions.

EXAMPLE 15

Figure 9:
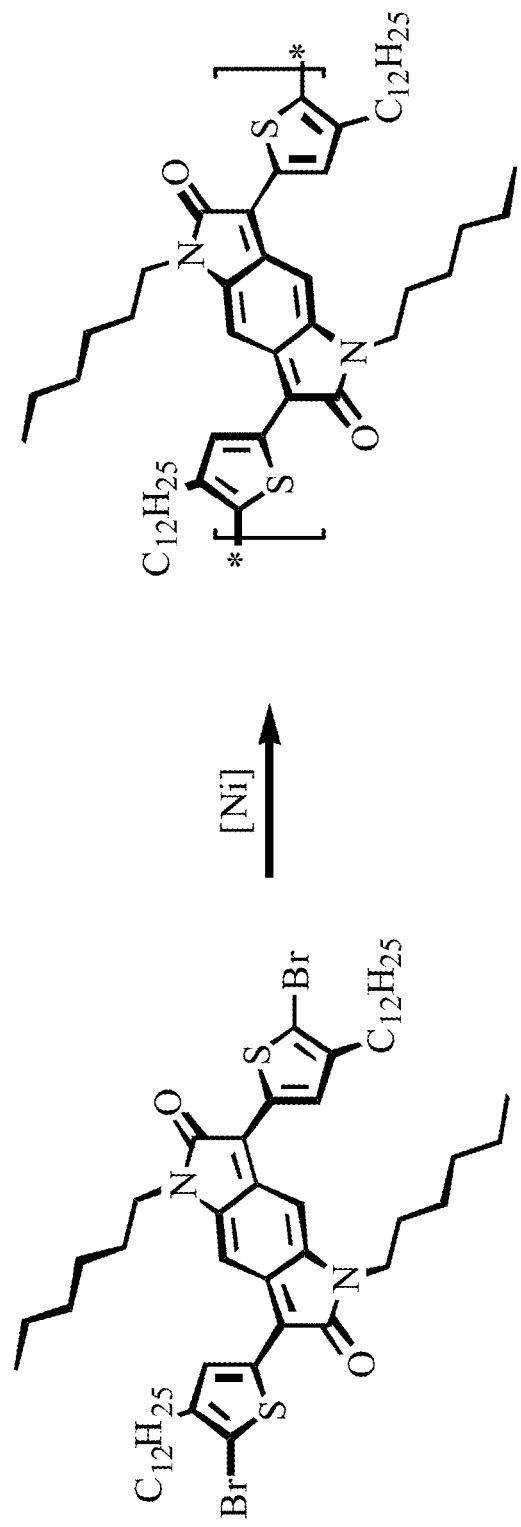
FIG. 9 shows a scheme for synthesis of benzodipyrrolidone-3-dodecylthiophene polymer (example 15).

Yamamoto Polymerization (see FIG. 9)

A mixture of 1,5-dihexyl-3,7-di-(5-bromo(4-dodecyl)thiophen-2-yl)-1H,5H-pyrrolo[2,3-f]indole-2,6-dione (0.170 g, 0.168 mmol), Ni(COD)$_2$ (0.069 g), bipyridine (0.039 g) and DMF/toluene (0.5 mL/4 mL) was heated at 90° C. for 24 h. -bromothiophene (0.035 g, 0.22 mmol) in toluene (1 mL) was added and the resulting mixture was stirred for another 12 h. Then after cooling to room temperature, the mixture was dropped into methanol to precipitate. After being filtered and dried, the precipitation was Soxhlet extracted with methanol, acetone, hexane, dichloromethane. A dark red solid (0.11 g, 80%) was obtained.

EXAMPLE 16

Figure 10:
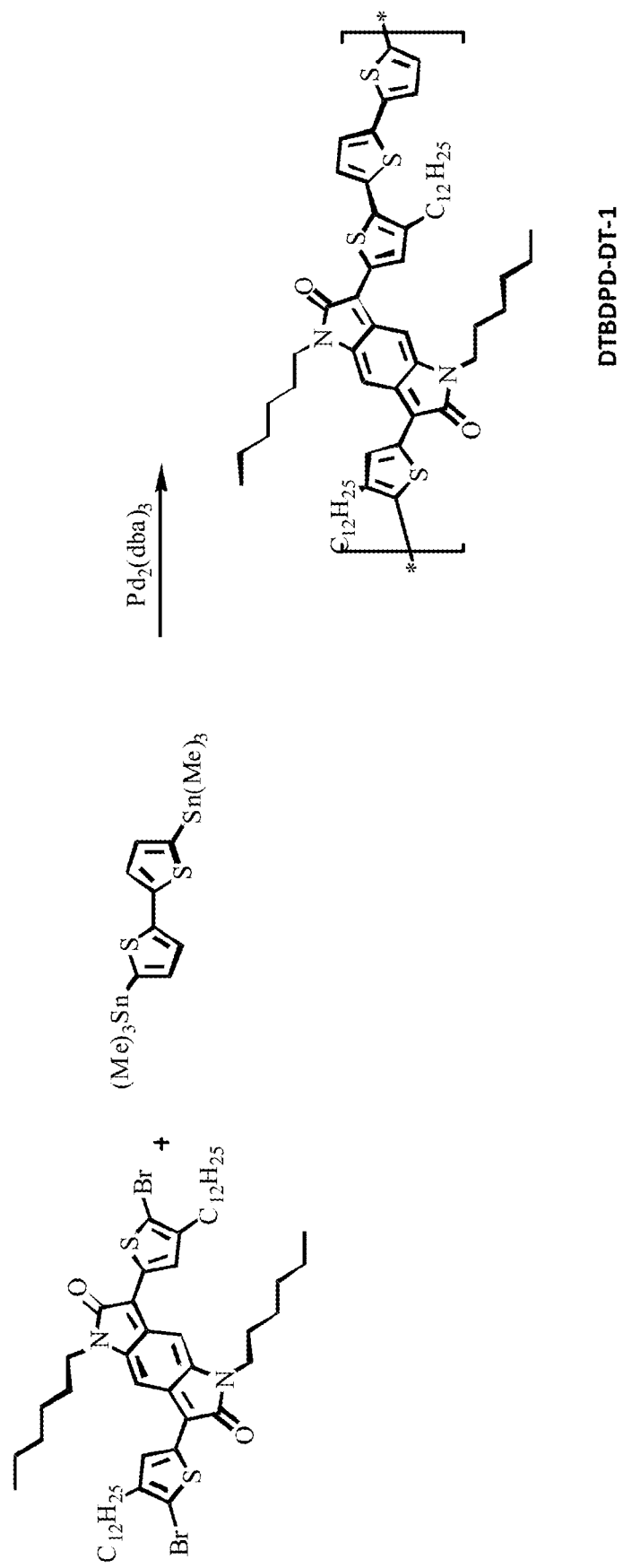
FIG. 10 shows a scheme for synthesis of benzodipyrrolidone-3-dodecylthiophene and dithiophene copolymer (example 16).

Stille Polymerization with Dithiophene (See FIG. 10)

A mixture of 1,5-dihexyl-3,7-di-(5-bromo(4-dodecyl)thiophen-2-yl)-1H,5H-pyrrolo[2,3-f]indole-2,6-dione (0.150 g, 0.148 mmol), 1,1'-[2,2'-bithiophene]-5,5'-diylbis[1,1,1-trimethyl]stannane (0.080 g, 0.163 mmol), Pd$_2$(dba)$_3$ (3 mg), (o-tol)$_3$P (4.5 mg) and toluene (10 mL) was heated at reflux for 24 h. 2-bromothiophene (0.070 g, 0.44 mmol) in toluene (1 mL) was added and the resulting mixture was stirred for another 12 h. Then, after cooling to room temperature, the mixture was dropped into methanol to precipitate. After being filtered and dried, the precipitation was Soxhlet extracted with methanol, acetone, hexane, dichloromethane. A solid was obtained (0.130 g, 86.7%) as a black solid.

EXAMPLE 17

Figure 11:
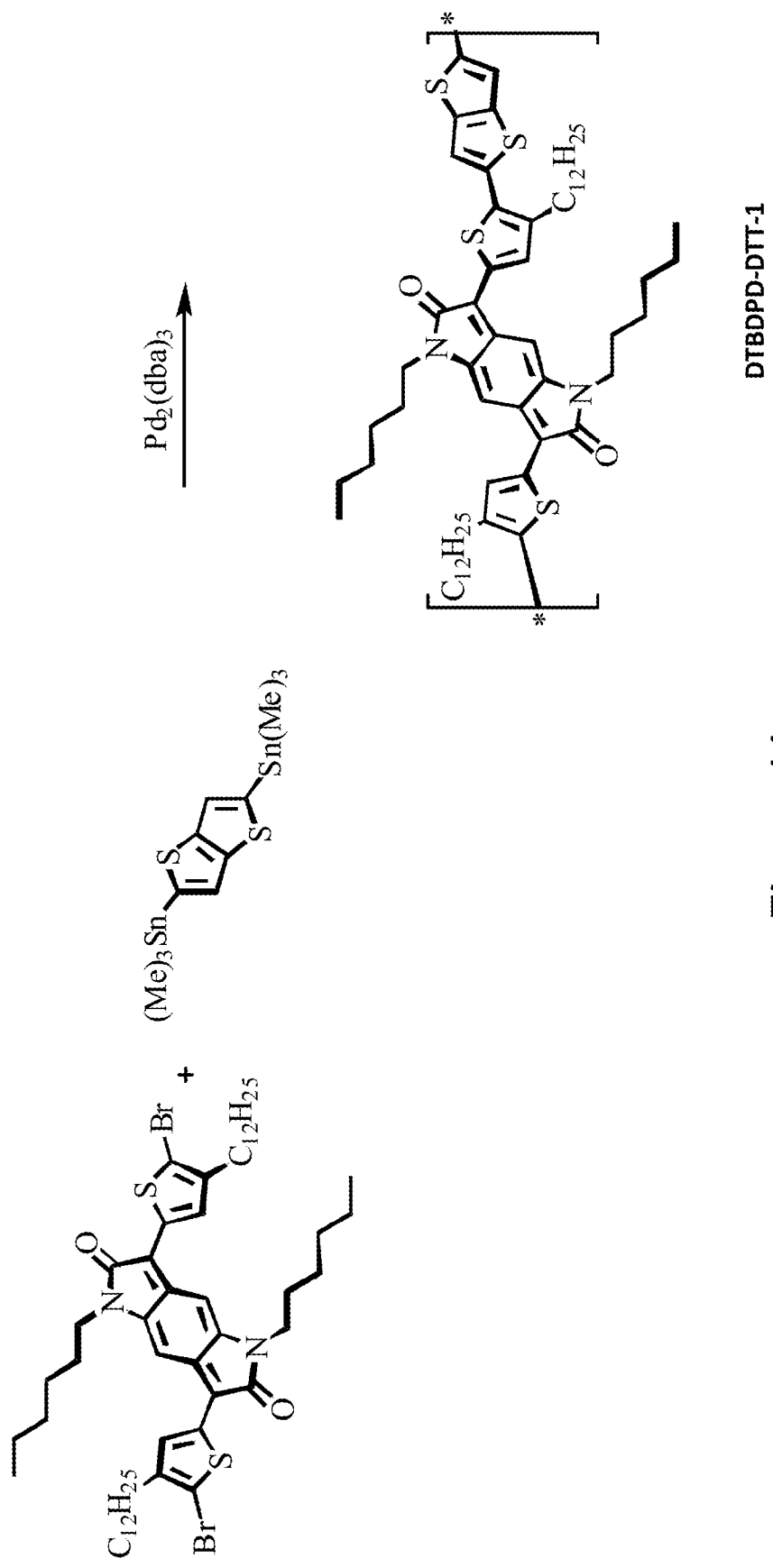
FIG. 11 shows a scheme for synthesis of benzodipyrrolidone-3-dodecylthiophene and dithienothiophene copolymer (example 17).

Stille Polymerization with Thienothiophene (See FIG. 11)

A mixture of 1,5-dihexyl-3,7-di-(5-bromo(4-dodecyl)thiophen-2-yl)-1H,5H-pyrrolo[2,3-f]indole-2,6-dione (0.150 g, 0.148 mmol), 1,1'-thieno[3,2-b]thiophene-2,5-diyl-bis[1,1,1-trimethyl]stannane (0.076 g, 0.16 mmol), Pd$_2$(dba)$_3$ (3 mg), (o-tol)$_3$P (4.5 mg) and toluene (10 mL) was heated at reflux for 24 h. 2-bromothiophene (0.070 g, 0.44 mmol) in toluene (1 mL) was added and the resulting mixture was stirred for another 12 h. Then, after cooling to room temperature, the mixture was dropped into methanol to precipitate. After being filtered and dried, the precipitation was Soxhlet extracted with methanol, acetone, hexane, dichloromethane. A solid was obtained (0.100 g, 66.7%) as a black solid.

EXAMPLE 18

Figure 12:
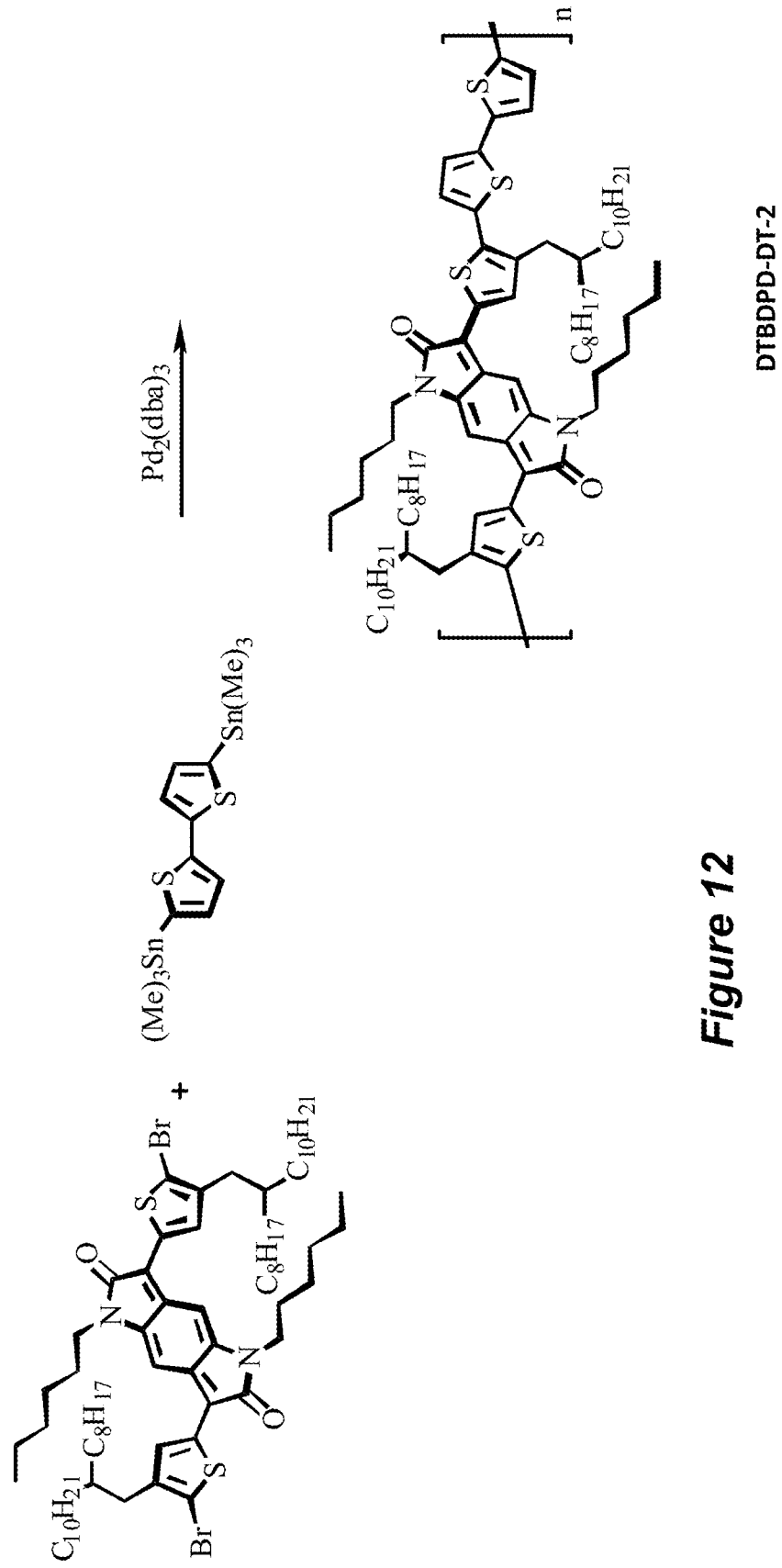
FIG. 12 shows a scheme for synthesis of benzodipyrrolidone-3-(2-octyldodecyl)thiophene and dithiophene copolymer (example 18).

Stille Polymerization with Thiophene (See FIG. 12)

A mixture of 1,5-Dihexyl-3,7-di-(5-bromo(4-(2-octyldodecyl))thiophen-2-yl)-1H,5H-pyrrolo[2,3-f]indole-2,6-dione (0.150 g, 0.121 mmol), 1,1'-[2,2'-bithiophene]-5,5'-diyl-bis[1,1,1-trimethyl]stannane (0.065 g, 0.183 mmol), Pd$_2$(dba)$_3$ (4 mg), (o-tol)$_3$P (6 mg) and toluene (15 mL) was heated at reflux for 24 h. 2-bromothiophene (0.070 g, 0.44 mmol) in toluene (1 mL) was added and the resulting mixture was stirred for another 12 h. Then, after cooling to room temperature, the mixture was dropped into methanol to precipitate. After being filtered and dried, the precipitation was Soxhlet extracted with methanol, acetone, hexane, dichloromethane and chloroform in succession. The chloroform solution was concentrated and reprecipitated in methanol. The solid was filtered and dried to yield (0.133 g, 88.5%) as a black solid.

EXAMPLE 19

Figure 13:
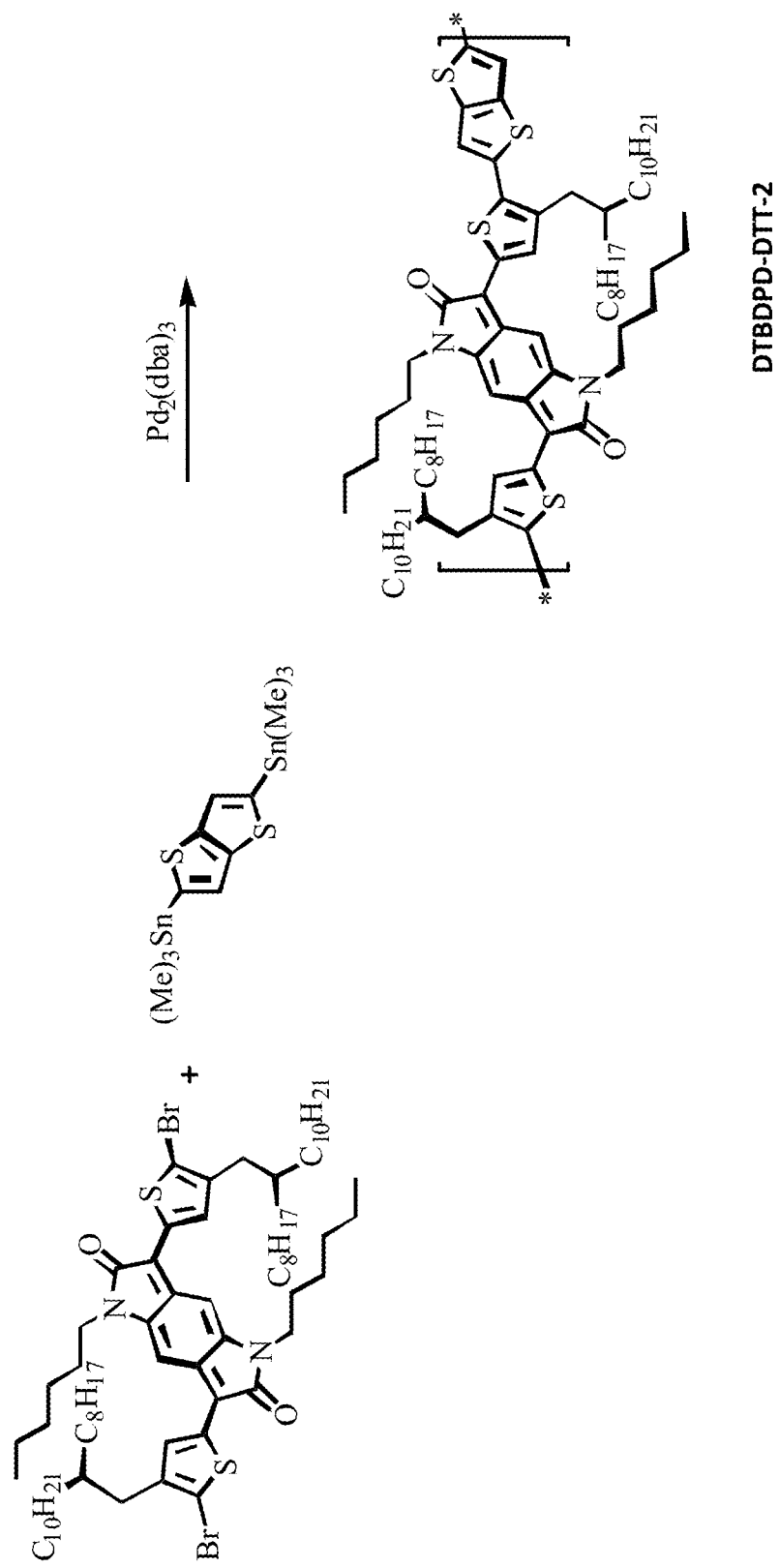
FIG. 13 shows a scheme for synthesis of benzodipyrrolidone-3-(2-octyldodecyl)thiophene and dithienothiophene copolymer (example 19).

Stille Polymerization with Thienothiophene (See FIG. 13)

A mixture of 1,5-Dihexyl-3,7-di-(5-bromo(4-(2-octyldodecyl))thiophen-2-yl)-1H,5H-pyrrolo[2,3-f]indole-2,6-dione (0.150 g, 0.121 mmol), 1,1'-thieno[3,2-b]thiophene-2,5-diylbis[1,1,1-trimethyl]stannane (0.065 g, 0.14 mmol), $Pd_2(dba)_3$ (4 mg), $(o\text{-tol})_3P$ (6 mg) and toluene (15 mL) was heated at reflux for 24 h. 2-bromothiophene (0.070 g, 0.44 mmol) in toluene (1 mL) was added and the resulting mixture was stirred for another 12 h. Then, after cooling to room temperature, the mixture was dropped into methanol to precipitate. After being filtered and dried, the precipitation was Soxhlet extracted with methanol, acetone, hexane, dichloromethane and chloroform in succession. The chloroform solution was concentrated and reprecipitated in methanol. The solid was filtered and dried to yield (0.120 g, 88%) as a black solid.

EXAMPLE 20

Figure 14:
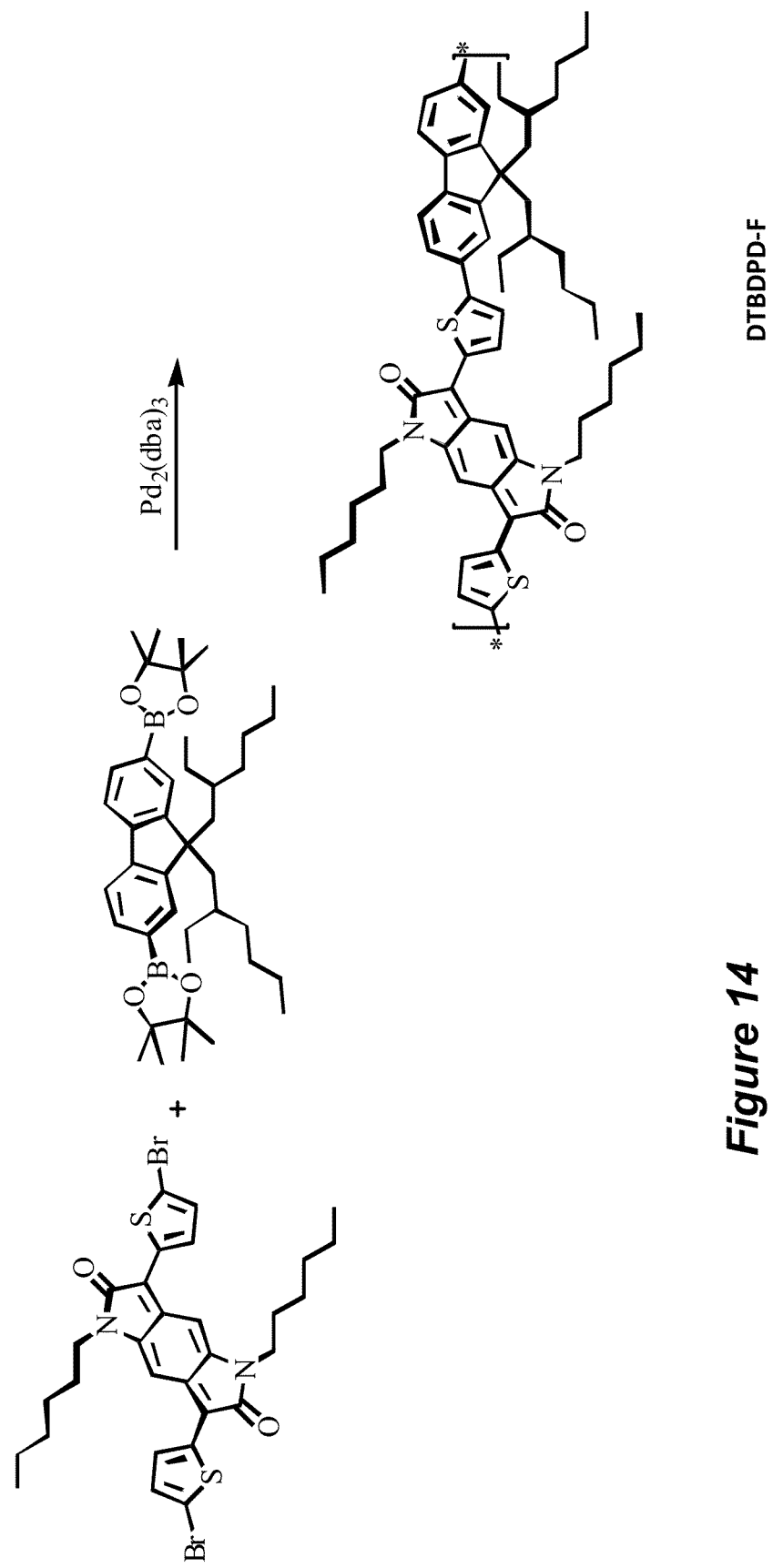
FIG. 14 shows a scheme for synthesis of benzodipyrrolidone-thiophene and fluorene copolymer (example 20).

Suzuki Polymerization with Fluorene (See FIG. 14)

A mixture of 1,5-Dihexyl-3,7-di-(5-bromothiophen-2-yl)-1H,5H-pyrrolo[2,3-f]indole-2,6-dione (0.150 g, 0.221 mmol), 2,7-bis(4,4,5,5-tetramethyl-1,3,2-dioxaborolan-2-yl)-9,9-di-ethylhexylfluorene (0.149 g, 0232 mmol), $Pd_2(dba)_3$ (5.0 mg), $(o\text{-tol})_3P$ (3.0 mg), $K_3PO_4$ (0.187 g) and toluene/$H_2O$ (20 mL/1 mL) was heated at reflux for 24 h. 2-bromothiophene (0.035 g, 0.22 mmol) in toluene (1 mL) was added and the resulting mixture was stirred for another 12 h. Then, after cooling to room temperature, the mixture was dropped into methanol to precipitate. After being filtered and dried, the precipitation was Soxhlet extracted with methanol, acetone, hexane, dichloromethane and chloroform in succession. The chloroform solution was concentrated and reprecipitated in methanol. The solid was filtered and dried to yield polymer (0.165 g, 82.5%) as a blue-green solid.

EXAMPLE 21

Figure 15:
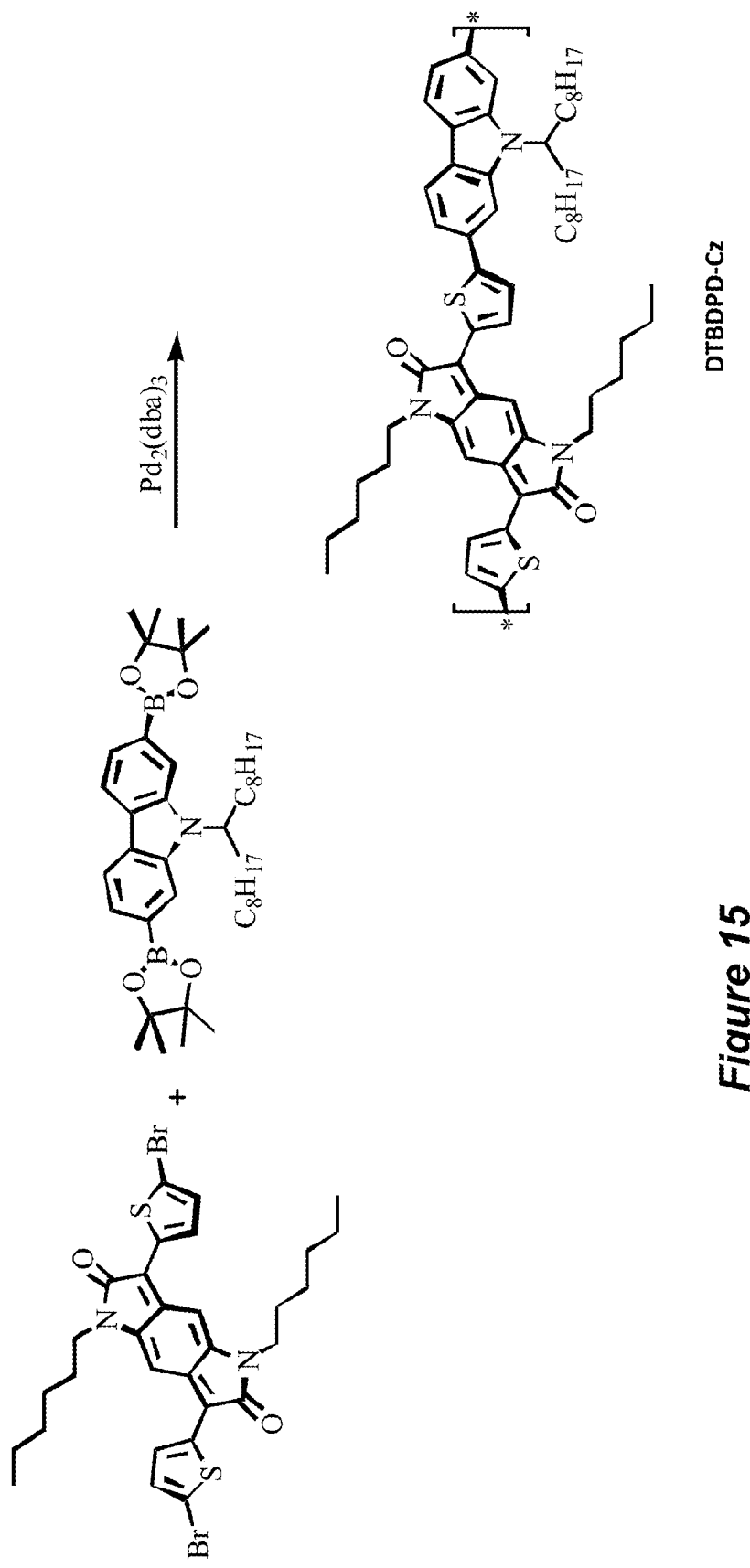
FIG. 15 shows a scheme for synthesis of benzodipyrrolidone-thiophene and carbazole copolymer (example 21).

Suzuki Polymerization with Carbazole (See FIG. 15)

A mixture of 1,5-dihexyl-3,7-di-(5-bromothiophen-2-yl)-1H,5H-pyrrolo[2,3-f]indole-2,6-dione (0.150 g, 0.221 mmol), 2,7-bis(4',4',5',5'-tetramethyl-1',3',2'-dioxaborolan-2'-yl)-N-9"i-heptadecanylcarbazole (0.152 g, 0232 mmol), $Pd_2(dba)_3$ (5.0 mg), $(o\text{-tol})_3P$ (3.0 mg), $K_3PO_4$ (0.187 g) and toluene/$H_2O$ (20 mL/1 mL) was heated at reflux for 24 h. 2-bromothiophene (0.035 g, 0.22 mmol) in toluene (1 mL) was added and the resulting mixture was stirred for another 12 h. Then, after cooling to room temperature, the mixture was dropped into methanol to precipitate. After being filtered and dried, the precipitation was Soxhlet extracted with methanol, acetone, hexane, dichloromethane. A black solid (0.170 g, 85%) was obtained.

EXAMPLE 22

Figure 16:
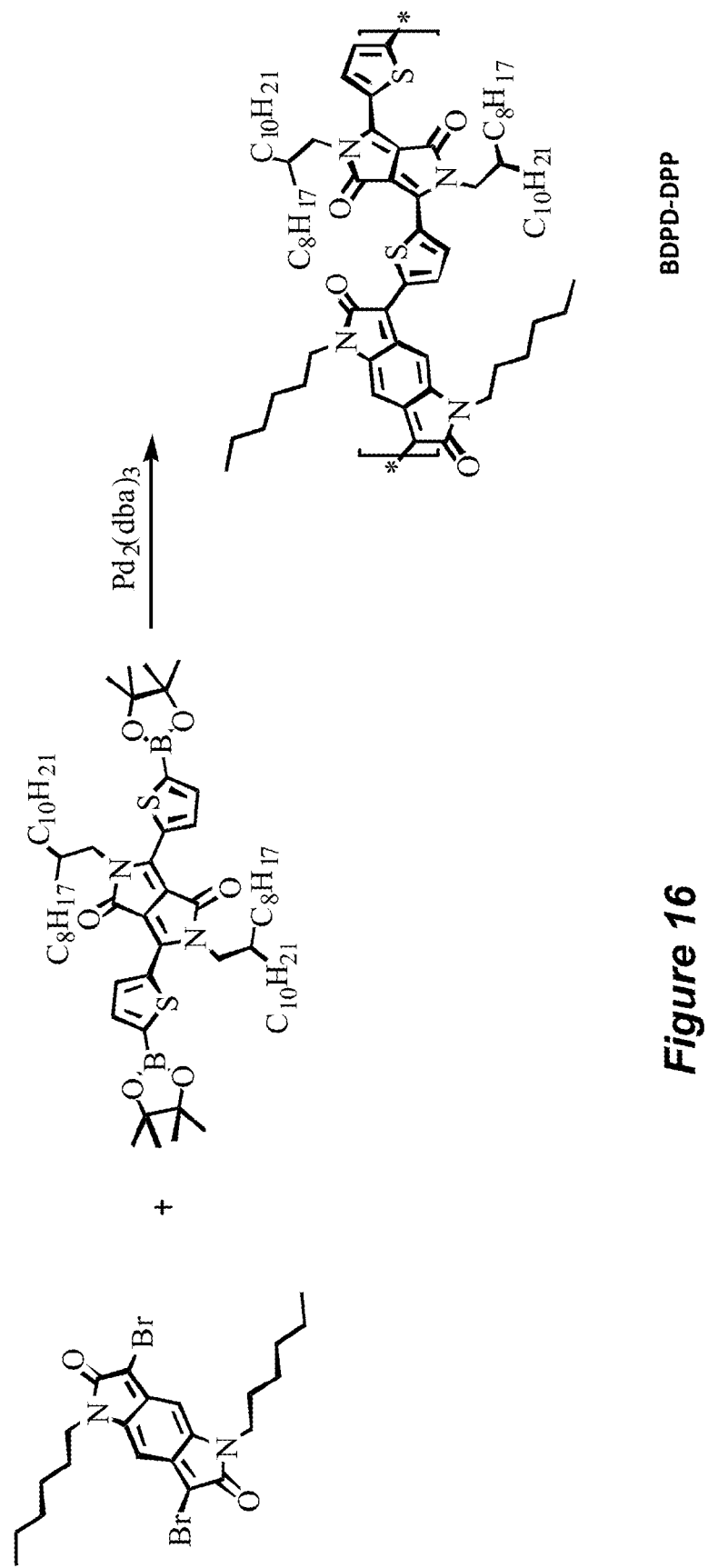
FIG. 16 shows a scheme for synthesis of benzodipyrrolidone and DPP copolymer (example 22).

Suzuki Polymerization with Diketopyrrolopyrrole (DPP) (See FIG. 16)

A mixture of 3,7-dibromo-1,5-dihexyl-1H,5H-pyrrolo[2,3-f]indole-2,6-dione (0.075 g, 0.148 mmol), 2,5-dihydro-2,5-bis(2-octyldodecyl)-3,6-bis[5-(4,4,5,5-tetramethyl-1,3,2-dioxaborolan-2-yl)-2-thienyl]-pyrrolo[3,4-c]pyrrole-1,4-dione (0.168 g, 0.150 mmol), $Pd_2(dba)_3$ (4.0 mg), tri-tert-butylphosphonium tetrafluoroborate (2.0 mg), $K_3PO_4$ (0.095 g) and toluene/$H_2O$ (8 mL/0.5 mL) was heated at reflux for 48 h. Then after cooling to room temperature, the mixture was dropped into methanol to precipitate. After being filtered and dried, the precipitation was Soxhlet extracted with methanol, acetone, hexane, dichloromethane and chloroform in succession. The chloroform solution was concentrated and reprecipitated in methanol. The solid was filtered and dried to yield polymer (0.130 g, 72.6%) as a black solid.

EXAMPLE 23

Figure 17:
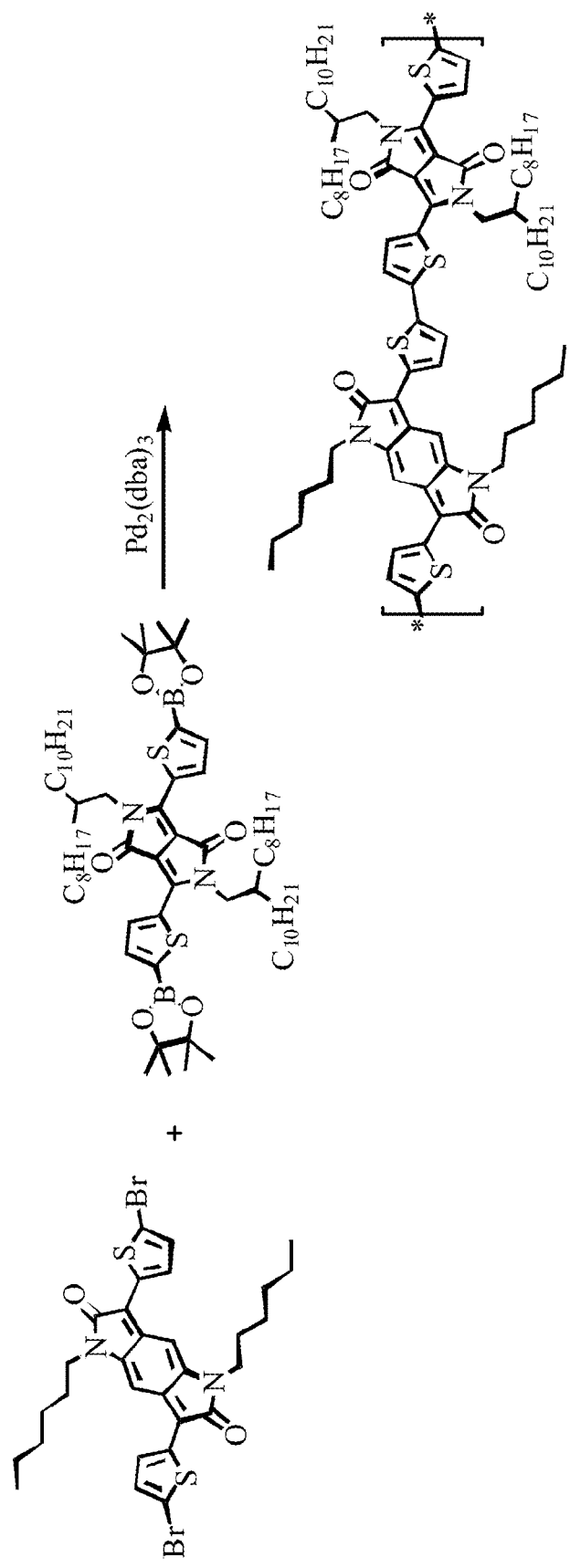
FIG. 17 shows a scheme for synthesis of benzodipyrrolidone-thiophene and DPP copolymer (example 23).

Suzuki Polymerization with Diketopyrrolopyrrole (DPP) (See FIG. 17)

A mixture of 1,5-dihexyl-3,7-di-(5-bromothiophen-2-yl)-1H,5H-pyrrolo[2,3-f]indole-2,6-dione (0.100 g, 0.148 mmol), 2,5-dihydro-2,5-bis(2-octyldodecyl)-3,6-bis[5-(4,4,5,5-tetramethyl-1,3,2-dioxaborolan-2-yl)-2-thienyl]-pyrrolo[3,4-c]pyrrole-1,4-dione (0.168 g, 0.150 mmol), $Pd_2(dba)_3$ (4.0 mg), tri-tert-butylphosphonium tetrafluoroborate (2.0 mg), $K_3PO_4$ (0.095 g) and toluene/$H_2O$ (8 mL/0.3 mL) was heated at reflux for 48 h. 2-bromothiophene (0.035 g, 0.22 mmol) in toluene (1 mL) was added and the resulting mixture was stirred for another 12 h. Then, after cooling to room temperature, the mixture was dropped into methanol to precipitate. After being filtered and dried, the precipitation was Soxhlet extracted with methanol, acetone, hexane, dichloromethane and chloroform in succession. The chloroform solution was concentrated and reprecipitated in methanol. The solid was filtered and dried to yield polymer (0.14 g, 70%) as a black solid.

EXAMPLE 24

Figure 18:
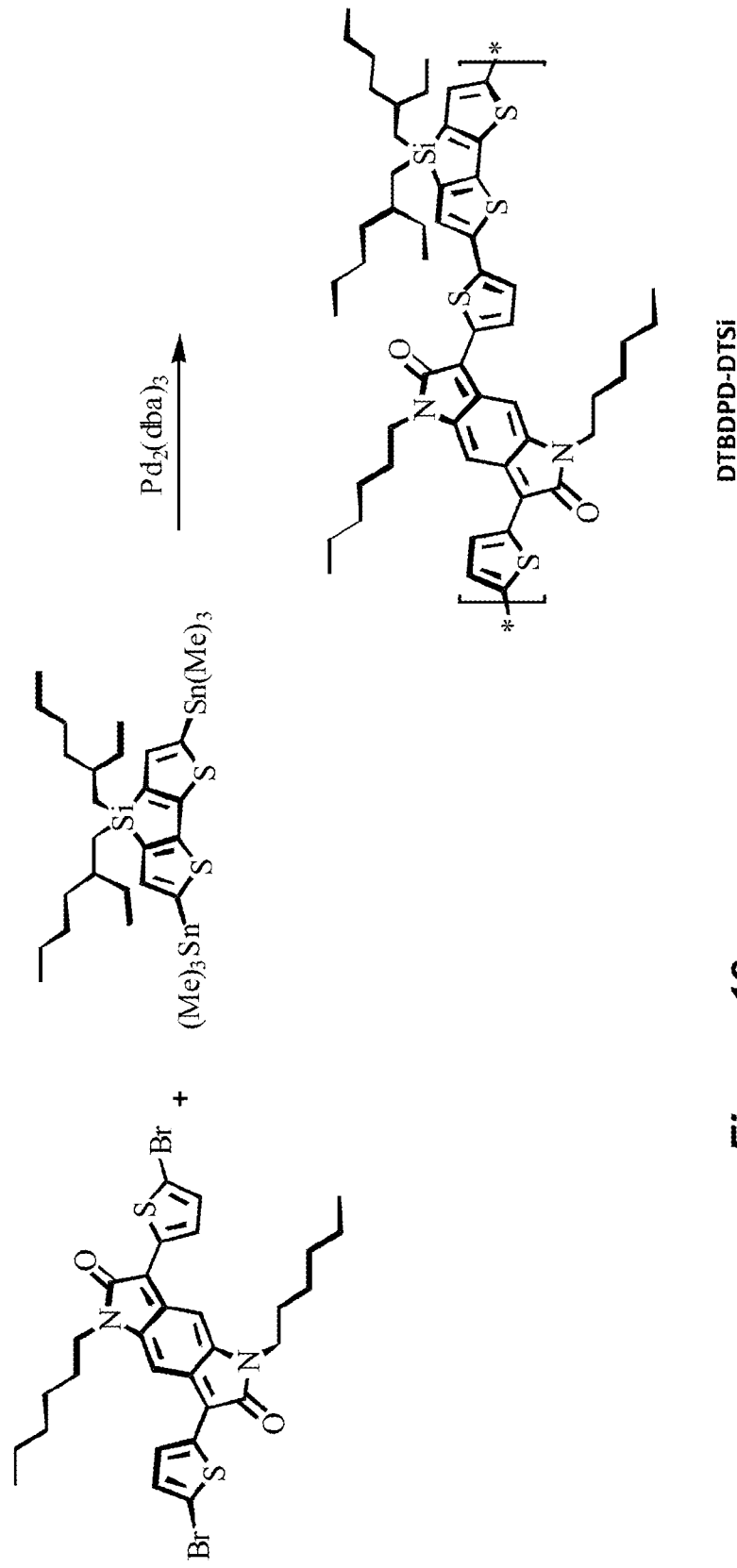
FIG. 18 shows a scheme for synthesis of benzodipyrrolidone-thiophene and dithienosilole copolymer (example 24).

Stille Polymerization with Dithienosilole (See FIG. 18)

A mixture of 1,5-Dihexyl-3,7-di-(5-bromothiophen-2-yl)-1H,5H-pyrrolo[2,3-f]indole-2,6-dione (0.115 g, 0.148 mmol), 4,4'-bis(2-ethylhexyl)-5,5'-bis(trimethyltin)dithieno[3,2-b:2',3'-d]silole (0.127 g, 0.170 mmol), $Pd_2(dba)_3$ (5 mg), $(o\text{-tol})_3P$ (3.0 mg) and toluene (20 mL) was heated at reflux for 24 h. 2-bromothiophene (0.070 g, 0.44 mmol) in toluene (1 mL) was added and the resulting mixture was stirred for another 12 h. Then after cooling to room temperature, the mixture was dropped into methanol to precipitate. After being filtered and dried, the precipitation was Soxhlet extracted with methanol, acetone, hexane, dichloromethane and chloroform in succession. The chloroform solution was concentrated and reprecipitated in methanol. The solid was filtered and dried to yield polymer (0.110 g, 79.7%) as a black solid.

EXAMPLE 25

Figure 19:
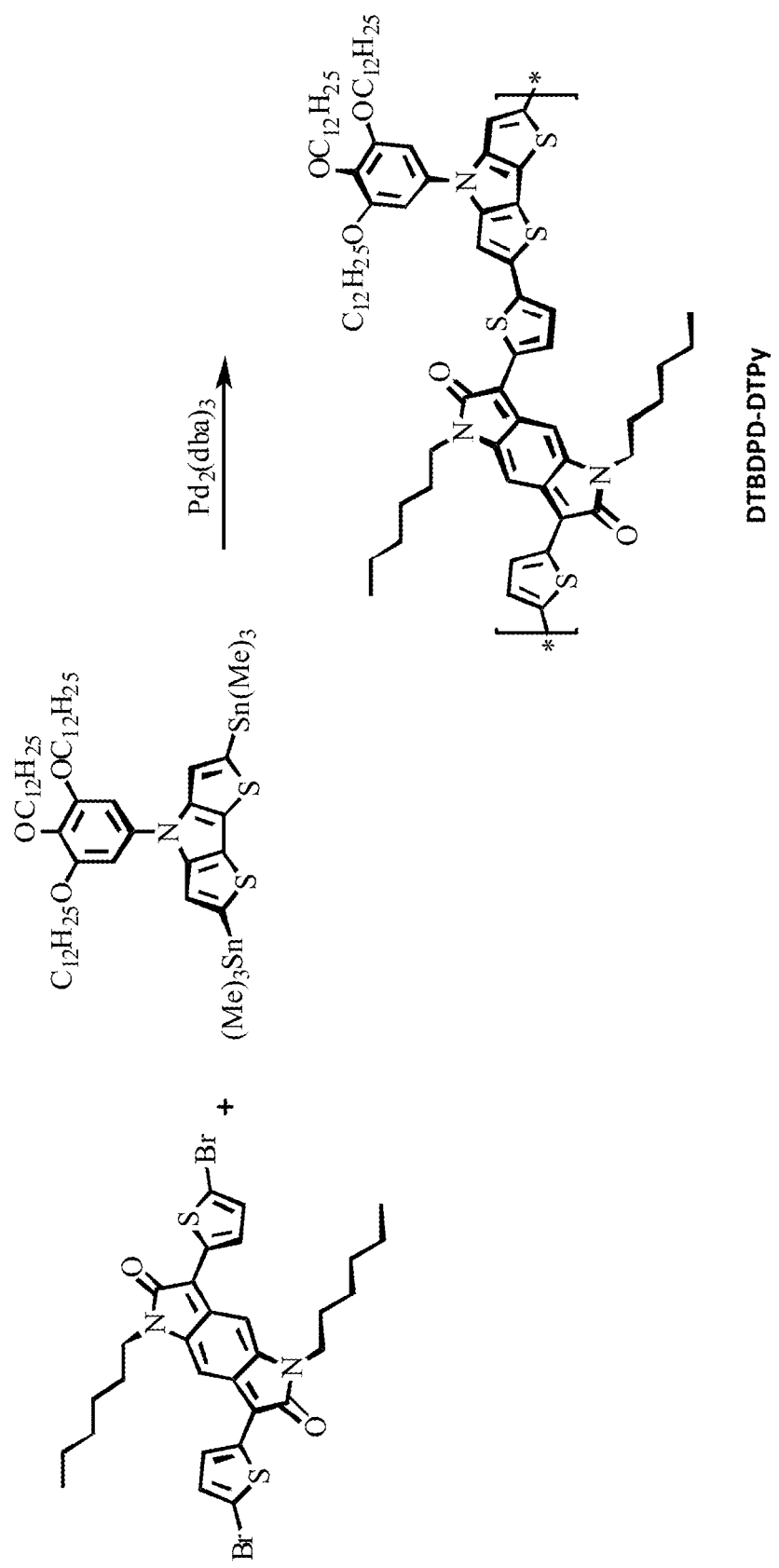
FIG. 19 shows a scheme for synthesis of benzodipyrrolidone-thiophene and dithienopyrrole copolymer (example 25).

Stille Polymerization with Dithienopyrrole (See FIG. 19)

A mixture of 1,5-dihexyl-3,7-di-(5-bromothiophen-2-yl)-1H,5H-pyrrolo[2,3-f]indole-2,6-dione (0.083 g, 0.123 mmol), 2,6-bis(trimethylstannyl)-4-[3,4,5-tris(dodecyloxy) phenyl]-4H-dithieno[3,2-b:2',3'-d]pyrrole (0.167 g, 0.147 mmol), Pd$_2$(dba)$_3$ (3 mg), (o-tol)$_3$P (4.5 mg) and toluene (10 mL) was heated at reflux for 24 h. 2-bromothiophene (0.070 g, 0.44 mmol) in toluene (1 mL) was added and the resulting mixture was stirred for another 12 h. Then after cooling to room temperature, the mixture was dropped into methanol to precipitate. After being filtered and dried, the precipitation was Soxhlet extracted with methanol, acetone, hexane, dichloromethane and chloroform in succession. The chloroform solution was concentrated and reprecipitated in methanol. The solid was filtered and dried to yield (0.140 g, 85.9%) as a black solid.

Fabrication of the Devices

Figures 24, 25, 26:
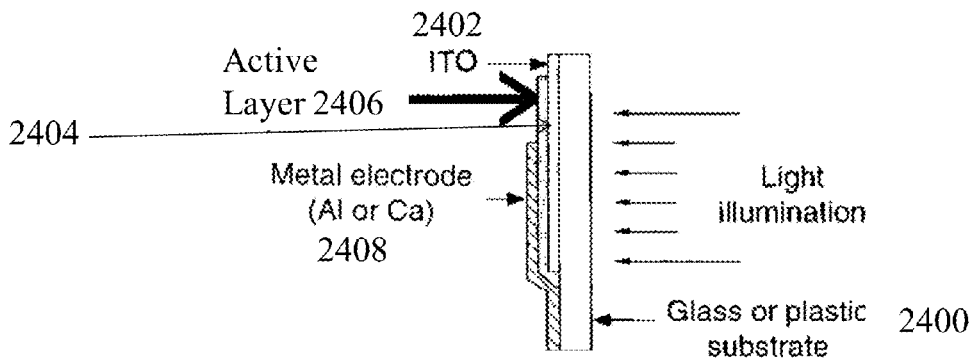
FIG. 24 is a cross sectional schematic of a solar cell having an active region including the polymer or small molecule, according to one or more embodiments of the invention.
FIG. 25 is a cross sectional schematic of a transistor or electronic device having an active region including the polymer or small molecule, according to one or more embodiments of the invention.
FIG. 26 is a cross sectional schematic of a light emitting diode having an active region including the polymer or small molecule, according to one or more embodiments of the invention.

FIGS. 24-26 illustrate devices comprising a compound with the following structure:

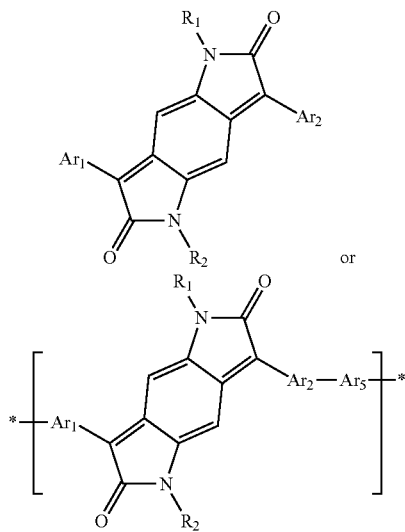

where R$_1$ and R$_2$ can be independently selected from any length alkyl chain unit and Ar$_1$ Ar$_2$ and Ar$_5$ can be independently selected from any aromatic group.

The compounds can be the electron acceptor and/or electron donor in an active or photoactive layer of said device. The electron donor can be a polymer or a small molecule semiconductor.

Solar Cells

Polymers and small molecules containing benzodipyrrolidone units exhibit narrow bandgap (<2 eV) and strong long wavelength absorption extending to the near IR region which are good for light harvesting. Strong π-π interaction between the electron-delocalized large benzodipyrrolidone rings lead to good charge mobility of these materials. These properties make them good candidates as light-absorbing semiconductors (electron donors) in solar cell devices.

Some of polymers and small molecules containing benzodipyrrolidone units showed low LUMO levels in the range of −3.75 eV-4.0 eV due to the strong electron-withdrawing effect of the benzodipyrrolidone units, which make them good candidates as electron acceptors in solar cell devices. Energy levels of selected benzodipyrrolidone containing small molecules and polymers are listed in FIG. 23.

FIG. 24 illustrates a solar cell device structure according to one or more embodiments, comprising a substrate 2400, a transparent conductive layer 2402 on, above, or overlying the substrate, a p-type interface layer 2404 on, above, or overlying the transparent conductive layer 2402, an active layer 2406 (e.g., interpenetrating phase-separated donor-acceptor network composite or donor-acceptor heterojunction material) on, above, or overlying the p-type interface layer, and a metal contact 2408 on, above, or overlying the active layer 2406.

One or more examples of the solar cell devices were fabricated on indium tin oxide (ITO)-coated glass substrates 2400 (where the ITO is the transparent conductive layer 2402), which were previously cleaned using a four-step ultrasonic bath cleaning using an aqueous detergent solution, deionized water, acetone, then 2-propanol, sequentially. Substrates were then dried under a stream of nitrogen gas. Afterwards, thin films (~40 nm) of poly(3,4-ethylenedioxythiophene) poly(styrenesulfonate) (PEDOT:PSS) (Clevios VP AI 4083) were spin-coated onto the ITO slides at 4000 rpm for 45 sec. The PEDOT:PSS films were then dried on a hotplate at 165° C. for 30 min. The PEDOT:PSS can be the p-type interface layer 2404.

In one or more examples, the active layer 2406 comprises benzodipyrrolidone polymers or small molecules as donors, and C$_{70}$ PCBM as an acceptor.

To form this active layer 2406, 500 µL, of each solution was added to two separate vials, each containing 10 mg C$_{70}$ PCBM or 5 mg of polymer (or small molecule), and the polymer in one vial was combined with the C70 PCBM in the other vial resulting in a polymer (or small molecule):fullerene blend ratio of 1:2 by weight. The solvent additive, chloronaphthalene, was added to each blend solution at a vol/vol ratio of 5% (25 µL). Solutions were stirred and heated at 80° C. overnight.

Thin-films of the polymer (or small molecule): C$_{70}$ PCBM blend were deposited on the ITO/PEDOT:PPS substrates by filtering the solution through a 0.45 µm PTFE filter before spin-coating at 1200 rpm for 60 sec. Films were placed under a Petri dish cover to dry for ~1 hour. To complete the devices, ~35 nm Ca followed by ~70 nm Al were thermally evaporated onto the Bulk Heterojunction (BHJ) through a shadow mask, defining a solar cell area of 0.06 cm$^2$.

Since the benzodipyrrolidone unit is a strong electron accepting unit, polymers using the benzodipyrrolidone unit show lower LUMO (FIG. 23) than conventional semiconducting polymers such as P3HT, PCPDTBT, etc. Thus, for most of the benzodipyrrolidone polymers, the difference between the LUMO levels of the donor and the PCBM is less than 0.3 eV electron, which causes the ineffective charge transfer between donor and acceptor. Therefore, acceptors which have lower LUMO than PCBM are preferred in the organic photovoltaic devices using benzodipyrrolidone polymers. This happened to be the case in some of the devices when PCBM is used as the electron acceptor. Acceptors with LUMO level lower than PCBM can be, but are not limited to fullerenes substituted with electron-withdrawing groups, where the electron-withdrawing groups can be, but are not limited to CN, F, C$_1$, NO$_2$, SO$_3$R, PO$_3$R.

The electron acceptor can be a fullerene with the following structure:

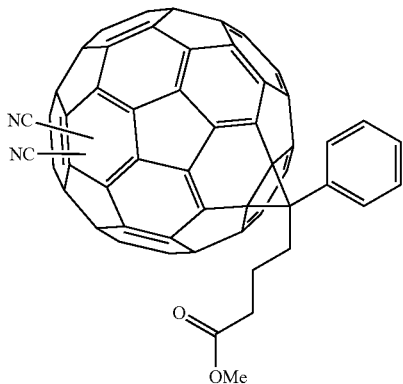

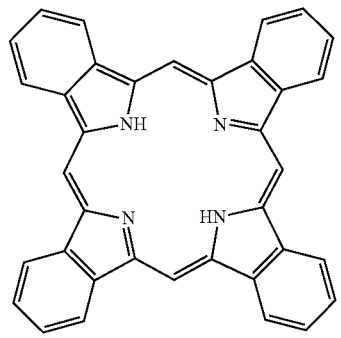
(I)

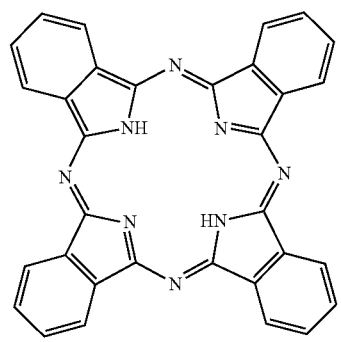
(II)

The following describes fabrication of a solar cell where Benzodipyrrolidone polymers or small molecules is used as acceptors, and tetrabenzoporphyrin is used as the donor, wherein the structure of tetrabenzoporphyrin (I) is shown below:

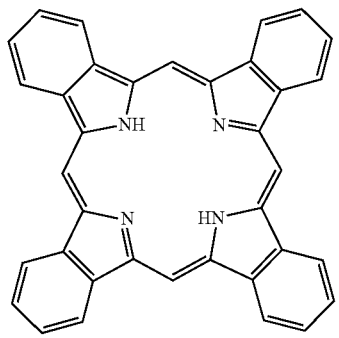

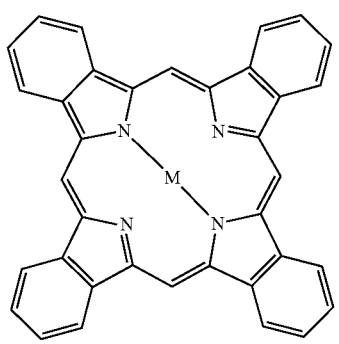
(III)

The solution of 1.0 wt % tetrabenzoporphyrin precursor (CP) in a mixture of chloroform:chlorobenzene (1:1 weight ratio) was spin-cast on the PEDOT:PSS layer in a nitrogen glove box with a spin rate of 800-1500 rpm. Thermal conversion of the CP to tetrabenzoporphyrin (BP) was then carried out at 180° C. for 20 minutes on a digital hotplate covered under Petri dish.

Thin films of the polymer (or small molecule) were deposited on the top of benzoporphyrin (BP) layer by filtering the solution throught a 0.45 µm PEFT filter before spin-coating at 1200 rpm for 60 sec. Films were placed under a Petri dish cover to dry for ~1 hour. To complete the devices, ~35 nm Ca followed by ~70 nm Al were thermally evaporated onto the films through a shadow mask, defining a solar cell area of 0.06 cm$^2$.

The electron donor can be a tetrabenzoporphyrin with formula I, or a phthalocyanine with formula II, or a metal containing tetrabenzoporphyrin with formula III, or a metal containing phthalocyanine with formula IV, or their derivatives; wherein: M can be selected from, but is not limited to Cu, Zn, Ti, Al, In, and wherein formula I, formula II, formula III, and formula IV are indicated below:

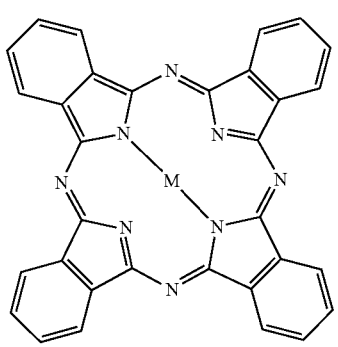
(IV)

EXAMPLE 26

Figure 20:
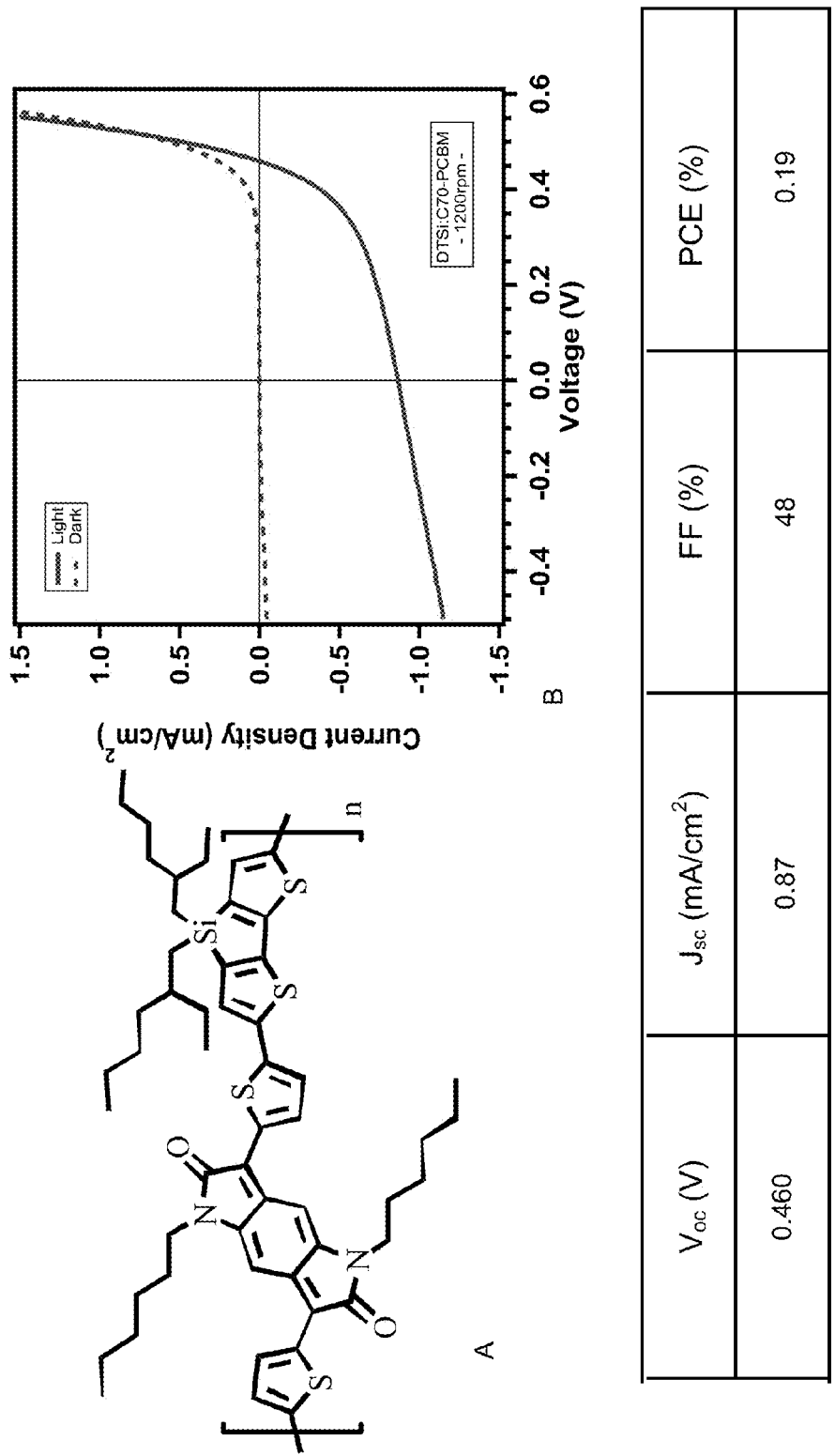
FIG. 20 shows solar cell device performance of benzodipyrrolidone-thiophene and dithienosilole copolymer, wherein FIG. 20 A shows the structure of the copolymer, FIG. 20 B shows the Current density-Voltage (IV) curve, and FIG. 20 C shows a table with device parameters, (example 26).

FIG. 20 illustrates solar cell device performance (IV curve and parameters) where the active layer comprises dithiophenebenzodipyrrolidone and dithienosilole copolymer (DTBDPD-DTSi) as donor and $C_{70}$ PCBM as acceptor.

Example 27

Figure 21:
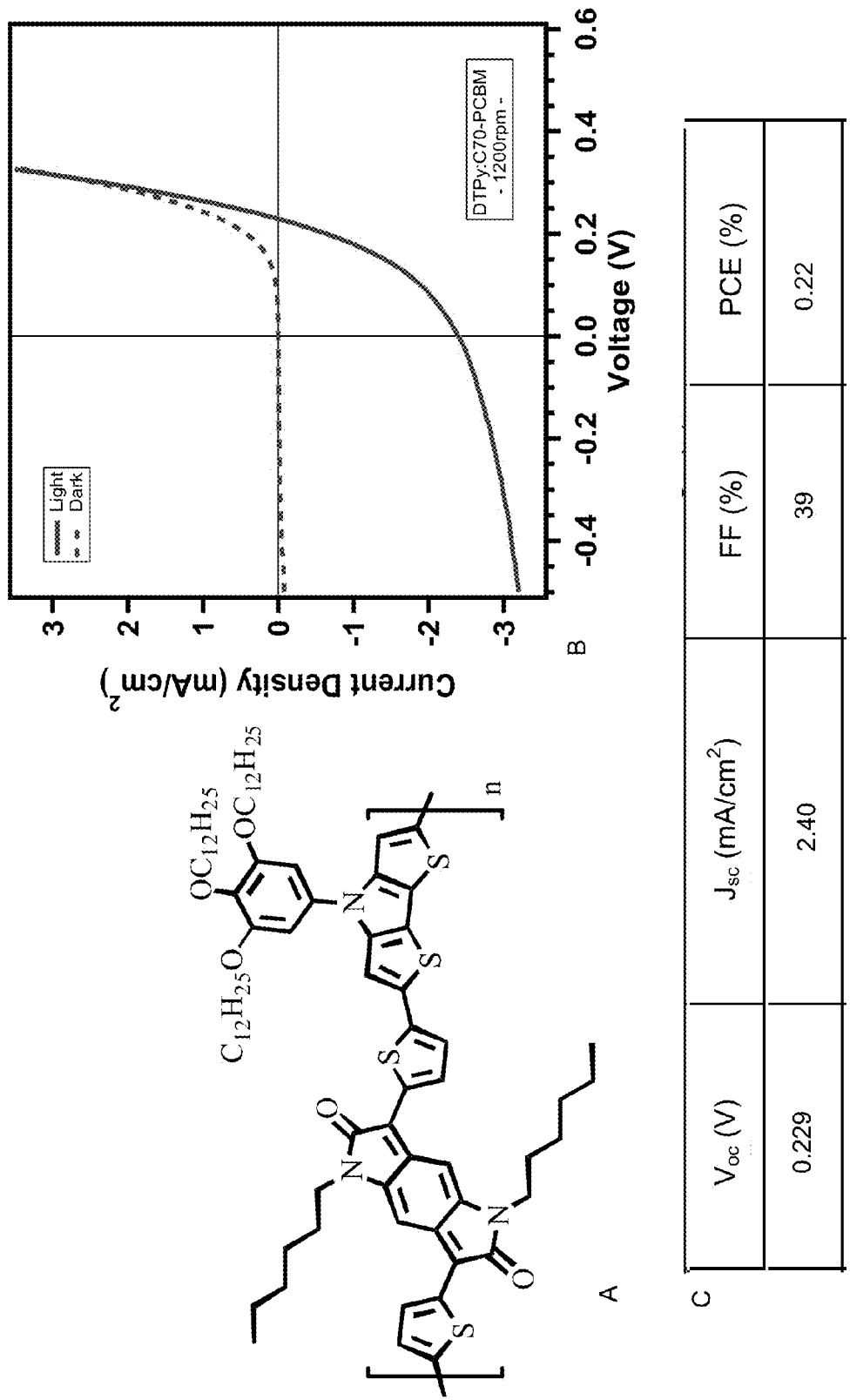
FIG. 21 shows solar cell device performance of benzodipyrrolidone-thiophene and dithienopyrrole copolymer, wherein FIG. 21 A shows the structure of the copolymer, FIG. 21 B shows the Current density-Voltage (IV) curve, and FIG. 21 C shows a table with device parameters (example 27).

FIG. 21 illustrates solar cell device performance (IV curve and parameters) where the active layer comprises dithiophenebenzodipyrrolidone and dithienpyrrole (DTB-DPD-DTPy) copolymer as donor and $C_{70}$ PCBM as acceptor.

Example 28 describes an example of solar cell device performance of BP as donor: dithiophenebenzodipyrrolidone and fluorene copolymer (DTBDPD-F) as acceptor (example 20, FIG. 14). The solar cell has open circuit voltage $V_{oc}$=0.44 V, short circuit current $J_{sc}$=0.54 mA/cm$^2$, fill factor FF=0.17, and power conversion efficiency (PCE) of 0.04%.

Example 29 describes an example of solar cell device performance of BP as donor: dithiophenebenzodipyrrolidone and dithienodipyrrole copolymer ((DTBDPD-DTPy) as acceptor (example 25, FIG. 19). The solar cell has $V_{oc}$=0.27 V, $J_{sc}$=0.49 mA/cm$^2$, FF=0.25, power conversion efficiency 0.03%.

Accordingly, one or more embodiments of the present invention obtain solar cells with a fill factor (FF) of at least 40%. One or more embodiments of the present invention obtain solar cells with a fill factor PCE of at least 0.2%.

The current density-voltage (J-V) characteristics were measured at 1 sun (AM 1.5G) in a N2-filled glovebox equipped with a Xenon lamp (Newport) and Keithley 2408 SMU.

Organic Thin Film Transistors Fabrication.

Benzodipyrrolidone containing small molecules and polymers showed good charge carrier mobility in organic thin film transistor devices due to the extended π conjugation of the electron-delocalized large benzodipyrrolidone ring and strong π-π interaction between the rings. These materials exhibited an ambipolar property with both good hole and electron mobilities, which make them useful in both n and p type transistors.

FIG. 25 illustrates an organic transistor structure, according to one or more embodiments, comprising a substrate 2500, a gate G on or above the substrate, a dielectric layer 2502 on the Gate G, an active layer 2504 on or above the dielectric layer 2502, and source S and drain D contacts contacting the active layer 2504.

Bottom gate/bottom contact field effect transistors as illustrated in FIG. 25 were fabricated by spin coating from polymer solution (10 mg/ml in chloroform) on to decyltrichlorosilane (DTS) treated $SiO_2$ (200 nm)/n++—Si substrate. The devices were then dried at 60° C. for 0.5 h and annealed at the desired temperature for 10 min in a glove box.

Following are examples of co-polymers that can be used in the active region of the transistor.

EXAMPLE 30

Dithiophenebenzodipyrrolidone-fluorene ((DTBDPD-F) copolymer, having the structure shown in FIG. 14, had a hole mobility of 2.1×10$^{-4}$ cm$^2$/V·s.

EXAMPLE 31

Dithiophenebenzodipyrrolidone-dithienosilole ((DTB-DPD-DTSi) copolymer, having the structure of FIG. 18, had the following mobilities: hole mobility of 5.3×10$^{-2}$ cm$^2$/V·s; electron mobility of 1.1×10$^{-2}$ cm$^2$/V·s.

EXAMPLE 32

Dithiophenebenzodipyrrolidone-dithienopyrrole (DTB-DPD-DTPy) copolymer, with the structure of FIG. 19, had a hole mobility of 0.21 cm$^2$/V·s.

EXAMPLE 33

Dithiophenebenzodipyrrolidone-DPP (DTBDPD-DPP) copolymer, with the structure of FIG. 17, had the following mobilities: a hole mobility of 1.0 cm$^2$/V·s; electron mobility of 1.0 cm$^2$/V·s.

EXAMPLE 34

Benzodipyrrolidone-DPP (BDPD-DPP) copolymer, having the structure of FIG. 16, had the following mobilities: hole mobility of 2.1×10$^{-4}$ cm$^2$/V·s; electron mobility of 7.2×10$^{-5}$ cm$^2$/V·s.

EXAMPLE 35

Dithiophenebenzodipyrrolidone-dithiophene (DTBDPD-DT) copolymer, having the structure of FIG. 10, had a hole mobility of 0.11 cm$^2$/V·s.

Example 36

Dithiophenebenzodipyrrolidone-dithienothiophene (DTBDPD-DTT) copolymer, having the structure of FIG. 11, had a hole mobility 0.011 CM$^2$/V·s.

Thus, one or more examples of the compounds of the present invention polymers can have a hole mobility of at least 1.0 cm$^2$/V·s. One or more examples of the compounds of the present invention can have an electron mobility of at least 1.0 cm$^2$/V·s.

FIG. 26 illustrates an optoelectronic device, an organic light emitting diode (OLED), comprising an active layer including a benzopyrrolidone containing compound according to one or more embodiments of the present invention. The OLED comprises a substrate 2600, a transparent conductive layer 2602 (e.g., ITO) on, above, or overlying the substrate 2600 (e.g., glass, plastic), a p-type hole transport layer 2604 on, above, or overlying the transparent conductive layer 2602, the active or emission layer 2606 on, above, or overlying the p-type hole transport layer 2604, an n-type electron transport layer 2608 on, above, or overlying the active layer 2606, and a metal contact 2610 to the n-type transport layer 2608. The active layer 2606 can comprise the benzopyrrolidone compound.

REFERENCES

The following references are incorporated by reference herein.

(1) (a) Friend, R. H.; Gymer, R. W.; Holmes, A. B.; Burroughes, J. H.; Marks, R. N.; Taliani, C.; Bradley, D. D. C.; Dos Santos, D. A.; Brédas, J. L.; Lögdlund, M.; Salaneck, W. R. *Nature* 1999, 397, 121-128. (b) Kraft, A.; Grimsdale, A. C.; Holmes, A. B. *Angew. Chem. Int. Ed.* 1998, 37, 402-428.

(2) (a) Dimitrakopoulos, C. D.; Malenfant, P. R. L. *Adv. Mater.* 2002, 14, 99-117.

(3) (a) Günes, S.; Neugebauer, H.; Sariciftci, N. S. *Chem. Rev.* 2007, 107, 1324-1338. (b) Thompson, B. C.; Fréchet, J. M. J. *Angew. Chem. Int. Ed.* 2008, 47, 58-77.

(4) Farnum, D. G.; Mehta, G.; Moore, G. G. I.; Siegel, F. P. *Tetrahedron Lett.* 1974, 15, 2549-2552.

(5) (a) Bürgi, L.; Turbiez, M.; Pfeiffer, R.; Bienewald, F.; Kirner, H.; Winnewisser, C. *Adv. Mater.* 2008, 20, 2217-2224. (b) Bijleveld, J. C.; Zoombelt, A. P.; Mathijssen, S. G. J.; Wienk, M. M.; Turbiez, M.; De Leeuw, D. M.; Janssen, R. A. J. *J. Am. Chem. Soc.* 2009, 131, 16616-16617.

(6) Turbiez, M.; Janssen, R.; Wienk, M.; Kirner, H.; Düggeli, M.; Tieke, B.; Zhu, Y. W.O. Patent Application 2008/00064 A1, 2008.

(7) Li, Y. U.S. Patent Application 2009/65766 A1, 2009.

(8) (a) Nelson, T. L.; Young, T. M.; Liu, J.; Mishra, S. P.; Belot, J. A.; Balliet, C. L.; Javier, A. E.; Kowalewski, T.; McCullough, R. D. *Adv. Mater.* 2010, 22, 4617-4621. (b) Liu, Y.; Singh, S. P.; Sonar, P. *Adv. Mater.* 2010, 22, 4862-4866. (c) Sonar, P.; Singh, S. P.; Li, Y.; Soh, M. S.; Dodabalapur, A. *Adv. Mater.* 2010, 22, 5409-5413.

(9) (a) Li, Y.; Sonar, P.; Singh, S. P.; Soh, M. S.; Meurs, M. Tan, J. *J. Am. Chem. Soc.* 2011, 133, 2198-2204. (b) Ha, J. S.; Kim, K. H.; Choi, D. H. *J. Am. Chem. Soc.* 2011, DOI./10.1021/ja203189h. (c) Bronstein, H.; Chen, Z.; Ashraf, R. S.; Zhang, W.; Du, J.; Durrant, J. R.; Tuladhar, P. S.; Song, K.; Watkins, S. E.; Geerts, Y.; Wienk, M. M.; Janssen, R. A. J.; Anthopoulos, T.; Sirringhaus, H.; Heeney, M.; McCulloch, I. *J. Am. Chem. Soc.* 2011, 133, 3272-3275.

(10) (a) Wienk, M. M.; Turbiez, M.; Gilot, J.; Janssen, R. A. J. Adv. Mater. 2008, 20, 2556-2560. (b) Zou, Y.; Gendron, D.; Badrou-Rich, R.; Najari, A.; Tao, Y.; Leclerc, M. *Macromoecules* 2009, 42, 2891-2894. (c) Huo, L.; Hou, J.; Chen, H-Y.; Zhang, S.; Jiang, Y.; Chen, T. L.; Yang, Y. *Macromolecules* 2009, 42, 6564-6571. (d) Zou, Y.; Gendron, D.; Neagu-Plesu, R.; Leclerc, M. *Macromolecules* 2009, 42, 6361-6365. (e) Kanimozhi, C.; Balraju, P.; Sharma, G. D.; Patil, S. *J. Phys. Chem. B* 2010, 114, 3095-3103.

(11) (a) Bijleveld, J. C.; Gevaerts, V. S.; Nuzzo, D. D.; Turbiez, M.; Mathijssen, S. G. J.; de Leeuw, D. M.; Wienk, M. M.; Janssen, R. A. *J. Adv. Mater.* 2010, 22, E242-E246. (b) Woo, C. H.; Beaujuge, P. M.; Holcombe, T. W.; Lee, O. P.; Fréchet, J. M. J. *J. Am. Chem. Soc.* 2010, 132, 15547-15549.

(12) (a) Tamayo, A. B.; Tantiwiwat, M.; Walker, B.; Nguyen, T-Q. *J. Phys. Chem. C* 2008, 112, 15543-15552. (b) Walker, B.; Tamayo, A. B.; Dang, X-D.; Zalar, P.; Seo, H.; Garcia, A.; Tantiwiwat, M.; Nguyen, T-Q. *Adv. Funct. Mater.* 2009, 19, 3063-3069.

(13) Qu, S.; Wu, W.; Hua, J.; Kong, C.; Long, Y.; Tian, H. *J. Phys. Chem. C* 2010, 114, 1343-1349.

(14) Greenhalgh, C. W. et al, (Dyes and Pigments 1980, 1, 103-120)

(15) Cui, W. B. et al, Macromolecules 2011, 44, 7869-7873).

(16) PCT International Publication No. WO 2012/003918 A1.

(17) Molecular Self-Assembled Monolayers and Multilayers for Organic and Unconventional Inorganic Thin-Film Transistor Applications, Sara A. DiBenedetto et. al, Adv. Mater. 2009, 1407-1433,

(18) A high-mobility electron-transporting polymer for printed transistors, He Yan et. al., Vol 457|5 Feb. 2009|doi:10.1038/nature07727.

(19) Polymer solar cells, Gang Li et. al., nature photonics|VOL 6|MARCH 2012|www.nature.com/naturephotonics.

(20) Polymer Photovoltaic Cells: Enhanced Efficiencies via a Network of Internal Donor-Acceptor Heterojunctions, SCIENCE•VOL. 270•15 Dec. 1995.

(21) Organic Electronics: From Materials to Devices, Yang Yang and Fred Wudl, Adv. Mater. 2009, 21, 1401-1403.

(22) Highly Efficient Polymer White-Light-Emitting Diodes Based on Lithium Salts Doped Electron Transporting Layer, Huang et. al., Adv. Mater. 2009, 21, 361.

Those of skill in the art will appreciate that one or more embodiments of the invention may be adapted for use with methods, materials, or devices known in the art or described in one or more of the above references.

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A composition of matter, comprising:

a compound or polymer having the formula:

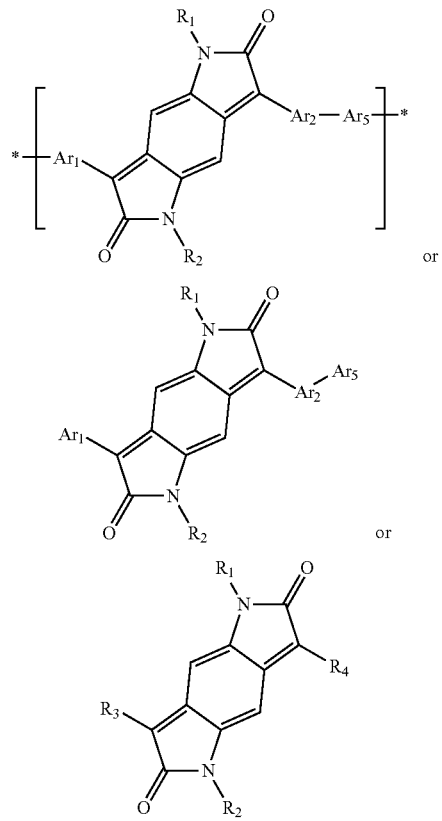

wherein:

R$_1$ and R$_2$ are each at least one member independently selected from H, C1-C30 alkyl, —C(O)O—C1-C30 alkyl, perfluoro-C1-C30 alkyl, C5-C30 aryl or aryl with heteroatoms, (CH2CH2O)$_n$ (n=1~20), alkoxy, alkenyl group, alkynyl group, allyl group, cycloalkyl group, cycloalkenyl group, ketone or aldehyde group, ester group, carbamoyl group silyl group, siloxanyl group, and any combination thereof, Ar$_1$ and Ar$_2$ are independently selected from any aromatic group comprising a thiophene but Ar$_1$ and Ar$_2$ cannot be a phenyl or substituted phenyl group, Ar$_5$ comprises an aromatic group of the structure:

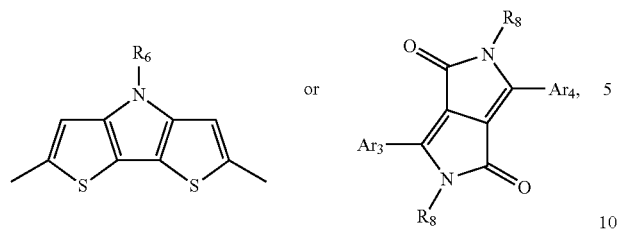

$R_8$ is a compound comprising Hydrogen and Carbon, $R_6$ is an aryl, $Ar_3$ and $Ar_4$ are each at least one compound independently chosen from an aromatic group, $R_6$, $R_8$, $Ar_3$, and $Ar_4$ are such that the polymer or the compound has a carrier mobility of at least 0.2 cm²/Vs, $R_3$ is Cl, Br, or I, and $R_4$ is Cl, Br, or I.

2. The composition of matter of claim 1, wherein $Ar_1$ and $Ar_2$ are independently selected from any aromatic group consisting of more than 6 sp² carbon atoms.

3. The composition of matter of claim 1, wherein:

$R_1$ and $R_2$ are independently selected from a group consisting of H, C1-C20 alkyl, —C(O)O—C1-C20 alkyl, perfluoro-C1-C20 alkyl, alkoxy, alkenyl group, alkynyl group, allyl group, cycloalkyl group, cycloalkenyl group, ketone or aldehyde group, ester group, carbamoyl group, silyl group, siloxanyl group, and any combination thereof, $Ar_1$ and $Ar_2$ are each independently a group having the structure:

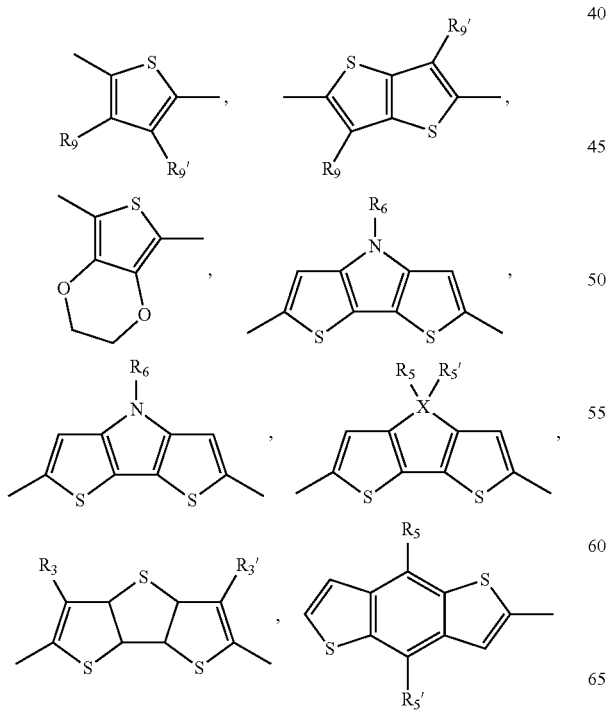

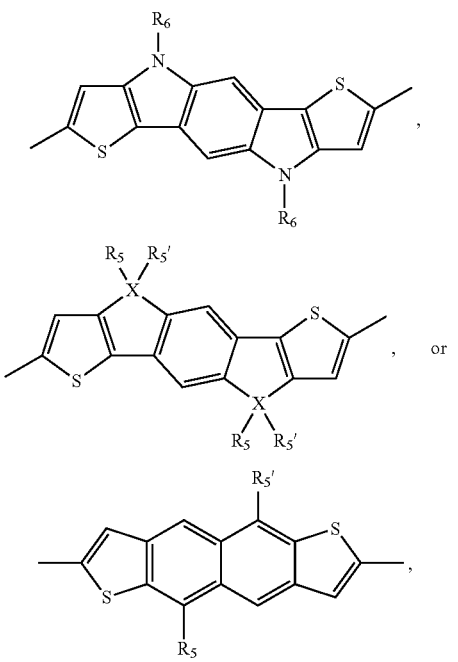

and $R_5$, $R_5'$, $R_6$, $R_9$, and $R_9'$ are each independently an organic structure.

4. The composition of matter of claim 1, wherein:

$Ar_1$ and $Ar_2$ are each independently at least one aromatic group having at least one structure chosen from:

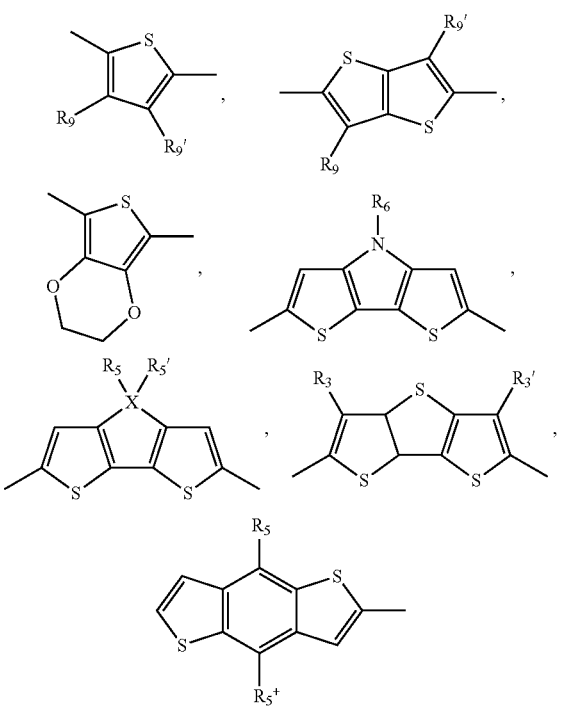

-continued

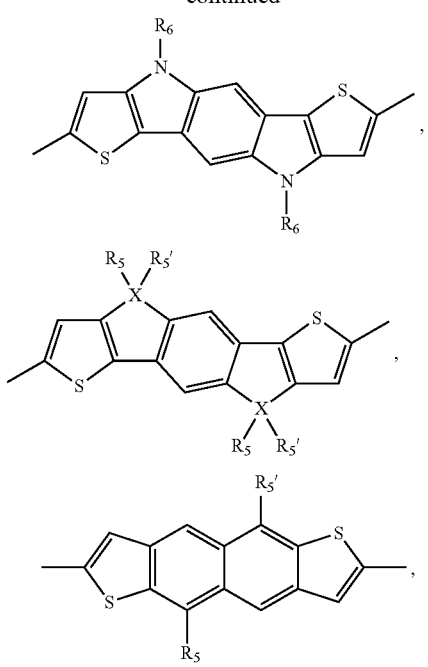

and $R_5$, $R_5'$, $R_6$, $R_9$, and $R_9'$ are each independently an organic structure.

5. The composition of matter of claim 1, wherein the composition of matter comprises the compound having the formula:

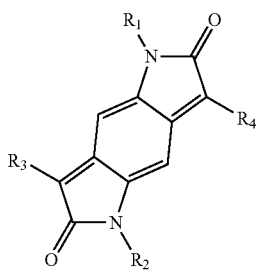

6. A device comprising an active layer including the polymer of claim 1, wherein the active layer has the hole mobility and/or electron mobility of at least 0.2 cm$^2$/V·s.

7. The device of claim 6, wherein the device is selected from a group consisting of a light-emitting diode, an organic thin film transistor, and an organic photovoltaic cell.

8. The device of claim 6, wherein the device is a photovoltaic cell comprising an electron donor and an electron acceptor, wherein one of the compounds:

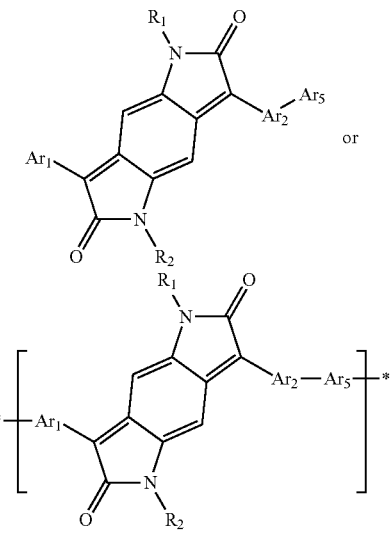

is the electron acceptor or electron donor in a photoactive layer of said device.

9. A process for making a composition of matter, wherein the composition of matter comprises a benzodipyrrolidone compound having the following structure:

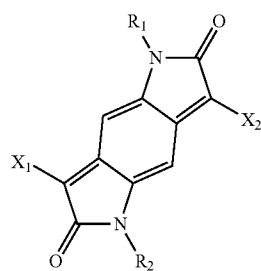

the process comprising: performing an elimination reaction on the following compound (D):

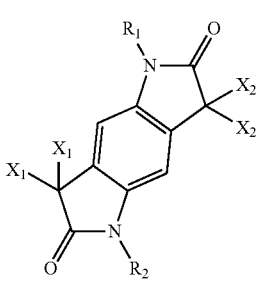

D wherein:
$R_1$ and $R_2$ are each at least one member independently selected from H, C1-C30 alkyl, —C(O)O—C1-C30 alkyl, perfluoro-C1-C30 alkyl, C5-C30 aryl or aryl with heteroatoms, (CH2CH2O)$_n$ (n=1~20), alkoxy, alkenyl group, alkynyl group, allyl group, cycloalkyl group, cycloalkenyl group, ketone or aldehyde group, ester group, carbamoyl group silyl group, siloxanyl group, and any combination thereof,
$X_1$ is Cl, Br, or I, $X_2$ is Cl, Br, or I, and so that the benzodipyrrolidone compound is made.

10. The process of claim 9, further comprising a halogenation step to obtain the compound (D).

11. The process of claim 9, wherein the elimination reaction comprises a reduction and dehalogenation of the compound D.

12. A process for making a composition of matter, comprising a small molecule organic semiconductor containing one or more benzodipyrrolidone units, the process comprising:

coupling a compound with an aromatic unit, where the compound has the following structure:

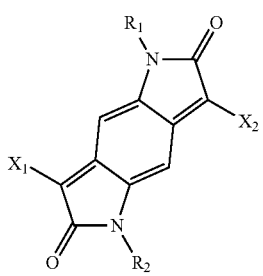

where $R_1$ and $R_2$ are each at least one member independently selected from any length alkyl chain unit, —C(O)O—C1-C30 alkyl, perfluoro-C1-C30 alkyl, C5-C30 aryl or aryl with heteroatoms, $(CH2CH2O)_n$ (n=1~20), alkoxy, alkenyl group, alkynyl group, allyl group, cycloalkyl group, cycloalkenyl group, ketone or aldehyde group, ester group, carbamoyl group silyl group, siloxanyl group, and any combination thereof, and $X_1$ is Cl, Br, or I, and $X_2$ is Cl, Br, or I.

13. The process of claim 9, further comprising performing polymerization reactions on the compound with the aromatic unit to make a composition of matter comprising a polymer semiconductor containing one or more benzodipyrrolidone units.

14. The device of claim 6, wherein:

the device is a transistor, and $Ar_1$, $Ar_2$, $Ar_5$, $R_1$, and $R_2$ are selected such that the active layer has the hole mobility and/or the electron mobility of at least 1.0 cm$^2$/V·s.

15. The composition of matter of claim 1, wherein $Ar_1$ and $Ar_2$ each comprise a thiophene and the carrier mobility is at least 1.0 cm$^2$/V·s.

16. The composition of matter of claim 1, wherein the polymer has the structure:

17. The composition of matter of claim 1, wherein the polymer has the structure:

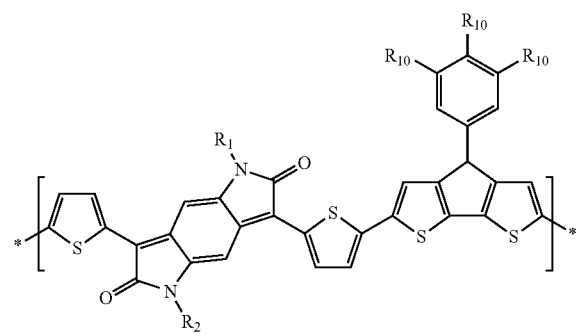

and each $R_{10}$ is at least one organic structure.

18. A method of fabricating an optoelectronic or electronic device comprising:

obtaining the small molecule organic semiconductor fabricated using the process of claim 12, or obtaining a polymer formed using a method including polymerizing the small molecule organic semiconductor; and fabricating the optoelectronic or electronic device comprising an active layer, the active layer comprising the polymer or the small molecule organic semiconductor.

19. An optoelectronic or electronic device comprising:

an active layer including:

the small molecule organic semiconductor fabricated using the process of claim 12, or a polymer formed using a method including polymerizing the small molecule organic semiconductor.

20. A transistor comprising the composition of matter of claim 1, including:

an active layer comprising the polymer having the formula:

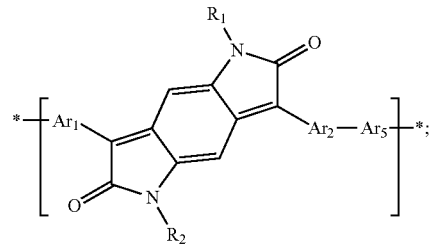

a drain contact to the polymer;

a source contact to the polymer;

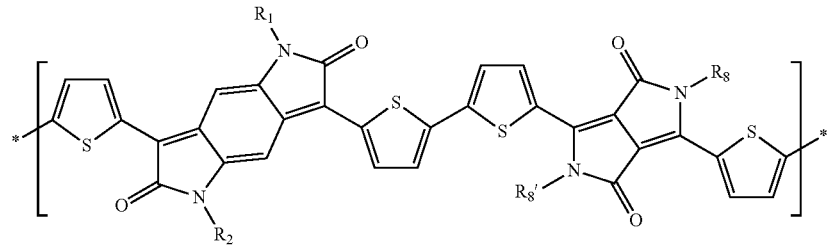

and $R_8$; and $R_8'$ are each at least one organic structure.

a gate connected to the polymer; and wherein the polymer is coated from a solution onto a dielectric and the dielectric is between the polymer and the gate.

21. A transistor, comprising:

an active layer comprising the polymer having the formula:

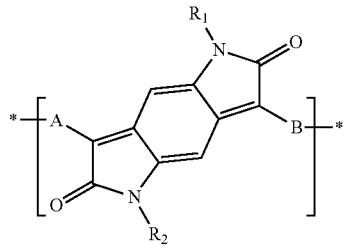

wherein:

$R_1$ and $R_2$ are each at least one member independently selected from H, C1-C30 alkyl, —C(O)O—C1-C30 alkyl, perfluoro-C1-C30 alkyl, C5-C30 aryl or aryl with heteroatoms, $(CH2CH2O)_n$ (n=1~20), alkoxy, alkenyl group, alkynyl group, allyl group, cycloalkyl group, cycloalkenyl group, ketone or aldehyde group, ester group, carbamoyl group, silyl group, siloxanyl group, and any combination thereof, A comprises an aromatic group, B comprises an aromatic group of the structure:

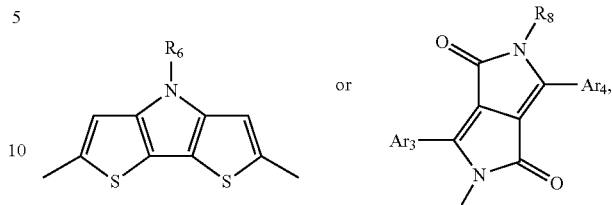

$R_8$ is a compound comprising Hydrogen and Carbon, $R_6$ is an aryl, $Ar_3$ and $Ar_4$ are each at least one compound independently chosen from an aromatic group, and $R_6$, $R_8$, $Ar_3$, and $Ar_4$ are such that the active layer has a carrier mobility of at least 0.2 $cm^2/V \cdot s$;

a drain contact to the polymer;

a source contact to the polymer;

a gate connected to the polymer; and wherein the polymer is coated from a solution onto a dielectric and the dielectric is between the polymer and the gate.

* * * * *